(12) United States Patent
Tomiyori et al.

(10) Patent No.: US 12,240,993 B2
(45) Date of Patent: Mar. 4, 2025

(54) ARTICLE WITH WATER AND OIL REPELLENT LAYER

(71) Applicant: AGC Inc., Tokyo (JP)

(72) Inventors: Yusuke Tomiyori, Tokyo (JP); Motoshi Aoyama, Tokyo (JP); Kenji Ishizeki, Tokyo (JP)

(73) Assignee: AGC Inc., Tokyo (JP)

(*) Notice: Subject to any disclaimer, the term of this patent is extended or adjusted under 35 U.S.C. 154(b) by 46 days.

(21) Appl. No.: 17/655,671

(22) Filed: Mar. 21, 2022

(65) Prior Publication Data
US 2022/0220318 A1 Jul. 14, 2022

Related U.S. Application Data

(63) Continuation of application No. PCT/JP2020/037757, filed on Oct. 5, 2020.

(30) Foreign Application Priority Data

Oct. 8, 2019 (JP) .................. 2019-185182

(51) Int. Cl.
*C09D 5/00* (2006.01)
*C03C 17/42* (2006.01)
(Continued)

(52) U.S. Cl.
CPC .............. *C09D 5/002* (2013.01); *C03C 17/42* (2013.01); *C08G 77/26* (2013.01); *C09D 1/02* (2013.01);
(Continued)

(58) Field of Classification Search
None
See application file for complete search history.

(56) References Cited

U.S. PATENT DOCUMENTS

| 10,786,976 B2* | 9/2020 | Zhou ..................... C08L 71/02 |
| 2010/0219367 A1* | 9/2010 | Dams ................... C07F 7/1804 |
| | | 252/8.62 |

(Continued)

FOREIGN PATENT DOCUMENTS

| JP | 2012-72272 A | 4/2012 |
| JP | 2014-218639 A | 11/2014 |

(Continued)

OTHER PUBLICATIONS

International Search Report issued Dec. 22, 2020 in PCT/JP2020/037757, filed on Oct. 5, 2020, 3 pages.

(Continued)

*Primary Examiner* — Ramsey Zacharia
(74) *Attorney, Agent, or Firm* — Oblon, McClelland, Maier & Neustadt, L.L.P.

(57) ABSTRACT

To provide an article with a water and oil repellent layer, which is excellent in friction resistance.
The article with a water and oil repellent layer of the present invention comprises a substrate, a water and oil repellent layer consisting of a hydrolyzed condensation product of a compound represented by the formula $[A\text{-}(OX)_m\text{-}]_j Y^1[\text{-Si}(R)_n L_{3-n}]_g$, and a silicon oxide layer containing alkali metal atoms that exists between the substrate and the water and oil repellent layer, wherein the average value of the concentration of alkali metal atoms in a predetermined area in the silicon oxide layer is at least a predetermined value. In the formula, X is a fluoroalkylene group, m is at least 2, j, g, and k are at least 1, and $Y^1$ and $Y^2$ are linking groups, R is a monovalent hydrocarbon group, L is a hydrolyzable group or hydroxy group, n is 0 to 2, A is a perfluoroalkyl group or $-Y^2[-\text{Si}(R)_n L_{3-n}]_n$. When A is $-Y^2[-\text{Si}(R)_n L_{3-n}]_k$, j is 1, and when A is a perfluoroalkyl group and j is 1, g is at least 2.

7 Claims, 1 Drawing Sheet

(51) Int. Cl.
- *C08G 77/26* (2006.01)
- *C09D 1/02* (2006.01)
- *C09D 183/08* (2006.01)
- *C23C 14/12* (2006.01)
- *C23C 14/24* (2006.01)

(52) U.S. Cl.
CPC ............ *C09D 183/08* (2013.01); *C23C 14/12* (2013.01); *C23C 14/24* (2013.01); *C03C 2217/76* (2013.01); *C03C 2218/116* (2013.01); *C03C 2218/151* (2013.01); *C03C 2218/31* (2013.01)

(56) References Cited

U.S. PATENT DOCUMENTS

| | | |
|---|---|---|
| 2014/0302332 A1 | 10/2014 | Murotani et al. |
| 2015/0307719 A1 | 10/2015 | Mitsuhashi et al. |
| 2015/0315443 A1 | 11/2015 | Takeda et al. |
| 2018/0030280 A1* | 2/2018 | Mitsuhashi .......... C08G 65/007 |
| 2019/0217580 A1* | 7/2019 | Zhou .................... G06F 1/1643 |
| 2020/0002567 A1* | 1/2020 | Mitsuhashi ............ C09D 5/00 |
| 2020/0095433 A1 | 3/2020 | Mitsuhashi et al. |

FOREIGN PATENT DOCUMENTS

| | | |
|---|---|---|
| WO | WO 2013/121984 A1 | 8/2013 |
| WO | WO 2014/126064 A1 | 8/2014 |
| WO | WO-2018235778 A1 * | 12/2018 ............. B05D 5/083 |
| WO | WO 2019/159981 A1 | 8/2019 |

OTHER PUBLICATIONS

Takenaka, "Composition Analysis of Glass", Asahi Glass Co., Ltd. Technology General Division, Innovative Technology Research Center, New Glass vol. 32 No. 120, 2017, 5 Pages.

* cited by examiner

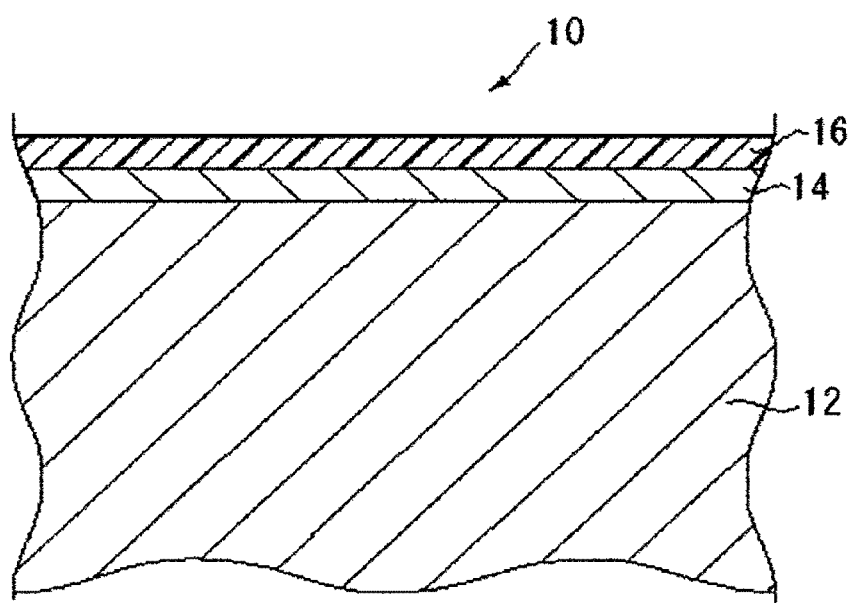

ARTICLE WITH WATER AND OIL REPELLENT LAYER

TECHNICAL FIELD

The present invention relates to an article with a water and oil repellent layer.

BACKGROUND ART

In order to impart water and oil repellency, fingerprint smudge removability, and lubricity (smoothness when touched with a finger) to the surface of a substrate, it is known to form a water and oil repellent layer consisting of a condensation product of a fluorinated compound on the surface of the substrate by surface treatment using a fluorinated compound having poly(oxyperfluoroalkylene) chains and reactive silyl groups.

Further, in order to improve the adhesion between the substrate and the water and oil repellent layer, an underlayer is provided between them. For example, Patent Document 1 discloses that a silicon oxide layer is provided between the substrate and the water and oil repellent layer.

For example, Patent Documents 1 and 2 disclose the installation of a silicon oxide layer by vapor deposition between the substrate and the water and oil repellent layer, and Patent Document 3 discloses the installation of an underlayer consisting of a hydrolyzed condensed product of e.g. $Si(NCO)_4$ between the substrate and the water and oil repellent layer.

PRIOR ART DOCUMENTS

Patent Documents

Patent Document 1: JP-A-2014-218639
Patent Document 2: JP-A-2012-72272
Patent Document 3: WO2014/126064

DISCLOSURE OF INVENTION

Technical Problem

In recent years, the performance required for the water and oil repellent layer formed by using a fluorinated compound has become higher. For example, when the water and oil repellent layer is applied to a component that constitutes a surface to be touched by a finger, a water and oil repellent layer whereby the performance (e.g., water repellency) is less likely to decrease even if friction is repeated, i.e. a water and oil repellent layer excellent in friction resistance, is required.

When the present inventors have evaluated an article with a water and oil repellent layer, wherein the water and oil repellent layer is formed using a fluorinated compound on an underlayer containing silicon oxide as described in Patent Document 1, they have found that there is a room for improvement in the friction resistance of the water and oil repellent layer.

Therefore, it is an object of the present invention to provide an article with a water and oil repellent layer, wherein the water and oil repellent layer is excellent in friction resistance.

Solution to Problem

As a result of diligent study of the above object, present inventors have found that in an article with a water and oil repellent layer, which comprises a substrate, a water and oil repellent layer, and a silicon oxide layer containing alkali metal atoms, that exists between the substrate and the water and oil repellent layer, if a silicon oxide layer in which the concentration of alkali metal atoms in a specific depth region is within a specific range is used, and if a water and oil repellent layer formed by using a fluorinated compound with a specific structure is used, the water and oil repellent layer is excellent in friction resistance, and thus have arrived at the present invention.

That is, the present inventors have found that the above problem can be solved by the following construction.

[1] An article with a water and oil repellent layer, characterized by comprising a substrate, a water and oil repellent layer consisting of a hydrolyzed condensation product of a fluorinated compound represented by the formula (1), and a silicon oxide layer containing alkali metal atoms, that exists between the substrate and the water and oil repellent layer, wherein in the silicon oxide layer, the average value of the concentration of the alkali metal atoms in a region with a depth of from 0.1 to 0.3 nm from the surface in contact with the water and oil repellent layer is at least $2.0 \times 10^{19}$ atoms/cm$^3$:

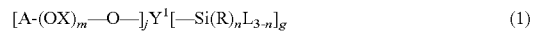  (1)

provided that in the formula (1), X is a fluoroalkylene group having at least one fluorine atom, m is an integer of at least 2, j is an integer of at least 1, $Y^1$ is a (j+g) valent linking group, R is a monovalent hydrocarbon group, L is a hydrolyzable group or a hydroxy group, n is an integer of from 0 to 2, g is an integer of at least 1, and A is a perfluoroalkyl group or $—Y^2[—Si(R)_nL_{3-n}]_k$, where $Y^2$ is a (k+1) valent linking group, and k is an integer of at least 1, provided that when A is $—Y^2[—Si(R)_nL_{3-n}]_k$, j is 1, and when A is a perfluoroalkyl group and j is 1, g is an integer of at least 2.

[2] The article according to [1], wherein said fluorinated compound is a compound represented by the formula (1-1):

$$R^{f1}—(OX)_m—O—Y^{11}[—Si(R)_nL_{3-n}]_{g1} \quad (1\text{-}1)$$

provided that in the formula (1-1), X, m, R, n and L are the same as the definitions of X, m, R, n and L in the formula (1), respectively, $R^{f1}$ is a perfluoroalkyl group, $Y^{11}$ is a (g1+1) valent linking group, and g1 is an integer of at least 2.

[3] The article according to [1], wherein said fluorinated compound is a compound represented by the formula (1-2):

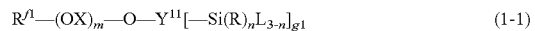  (1-2)

provided that in the formula (1-2), X, m, R, n and L are the same as the definitions of X, m, R, n and L in the formula (1), respectively, $R^{f2}$ is a perfluoroalkyl group, j2 is an integer of at least 2, $Y^{21}$ is a (j2+g2) valent linking group, and g2 is an integer of at least 2.

[4] The article according to [1], wherein said fluorinated compound is a compound represented by the formula (1-3):

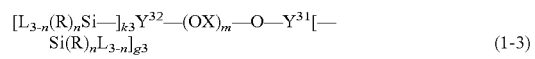  (1-3)

provided that in the formula (1-3), X, m, R, n and L are the same as the definitions of X, m, R, n and L in the formula (1), respectively, k3 is an integer of at least 1, $Y^{32}$ is a (k3+1) valent linking group, $Y^{31}$ is a (g3+1) valent linking group, and g3 is an integer of at least 1.

[5] The article according to any one of [1] to [4], wherein the average value of the concentration of the alkali metal atoms is at most $4.0 \times 10^{22}$ atoms/cm$^3$.

[6] The article according to any one of [1] to [5], wherein at least some of the alkali metal atoms are sodium atoms.

[7] The article according to any one of [1] to [6], wherein the silicon oxide in the silicon oxide layer consists of a condensed product of silicic acid or a hydrolyzed condensed product of an alkoxysilane.

[8] The article according to any one of [1] to [7], wherein the silicon oxide in the silicon oxide layer consists of a vapor deposit of silicon oxide containing alkali metal atoms.

[9] The article according to any one of [1] to [7], wherein the silicon oxide layer is a silicon oxide layer formed on the surface of the substrate by a wet coating method from a coating solution containing a silicon oxide precursor, an alkali metal source and a solvent.

[10] The article according to any one of [1] to [8], wherein the silicon oxide layer is a silicon oxide layer formed on the substrate by a dry coating method from silicon oxide containing alkali metal atoms.

Advantageous Effect of Invention

According to the present invention, it is possible to provide an article with a water and oil repellent layer, wherein the water and oil repellent layer is excellent in friction resistance.

BRIEF DESCRIPTION OF DRAWING

FIG. 1 is a cross-sectional view showing an example of the article with a water and oil repellent layer of the present invention.

DESCRIPTION OF EMBODIMENTS

In this specification, a compound represented by the formula (1) is referred to as a compound (1). Compounds represented by other formulas are also referred to in the same way. A group represented by the formula (A) is referred to as a group (A). Groups represented by other formulas are also referred to in the same way.

In this specification, in a case where it is said that "an alkylene group may have an A group", the alkylene group may have an A group between carbon-carbon atoms in the alkylene group, or it may have an A group at the terminal, like alkylene group-A group-.

In this specification, the "aryl group" in an "aryloxy group" includes not only an aryl group but also a heteroaryl group.

The meanings of terms in the present invention are as follows.

The "divalent organopolysiloxane residue" is a group represented by the following formula. $R^x$ in the following formula is an alkyl group (preferably one with from 1 to 10 carbon atoms) or a phenyl group. Further, g1 is an integer of at least 1, preferably from 1 to 9, particularly preferably from 1 to 4.

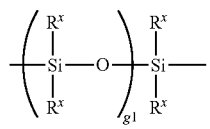

The "average molecular weight" of a compound is calculated by determining the number (average value) of oxyfluoroalkylene groups based on the terminal group by $^1$H-NMR and $^{19}$F-NMR.

The "alkali metal atoms" means lithium (Li), sodium (Na), potassium (K), rubidium (Rb) and cesium (Cs) atoms.

The dimensional ratios in FIG. 1 are different from the actual ones for convenience of explanation.

[Article with a Water and Oil Repellent Layer]

The article with a water and oil repellent layer of the present invention has a substrate, a water and oil repellent layer consisting of a hydrolyzed condensation product of a fluorinated compound represented by the formula (1) as described below, and a silicon oxide layer containing alkali metal atoms, that exists between the substrate and the water and oil repellent layer.

Further, in the above silicon oxide layer, the average value of the concentration of alkali metal atoms in the region of from 0.1 to 0.3 nm in depth from the surface in contact with the above water and oil repellent layer, is at least $2.0 \times 10^{19}$ atoms/cm$^3$.

The article with a water and oil repellent layer of the present invention is excellent in friction resistance of the water and oil repellent layer. The details of the reason for this have not been clarified, but it is assumed to be due to the following reasons.

That is, the average value of the concentration of alkali metal atoms being high means that there exists highly reactive Si—OM (where M is an alkali metal) in a large amount at the surface of the silicon oxide layer. Si—OM has high reactivity with the silanol group (Si—OH) formed by the hydrolysis reaction of the reactive silyl group in the fluorinated compound used to form the water and oil repellent layer. Therefore, the presence of a large amount of Si—OM increases the Si—O—Si bond, which is the junction point between the silicon oxide layer and the water and oil repellent layer. Further, since the fluorinated compound represented by the formula (1) given below has at least 2 reactive silyl groups, there will be many reaction points between the silanol groups derived from the reactive silyl groups of the fluorinated compound and the Si—OM of the silicon oxide layer, whereby the adhesion between the water and oil repellent layer and the silicon oxide layer is considered to be improved. As a result, the water and oil repellent layer tends to be less likely to peel off due to friction, and the water and oil repellent layer will be excellent in friction resistance.

FIG. 1 is a cross-sectional view showing an example of the article with a water and oil repellent layer of the present invention. The article 10 with a water and oil repellent layer has a substrate 12, a silicon oxide layer 14 formed on the surface of the substrate 12, and a water and oil repellent layer 16 formed on the surface of the silicon oxide layer 14.

In the example in FIG. 1, the silicon oxide layer 14 is formed on the entire surface of one of the substrate 12, but it is not limited to this, and the silicon oxide layer 14 may be formed only on a part of the substrate 12. Further, in the example in FIG. 1, the water and oil repellent layer 16 is formed on the entire surface of the silicon oxide layer 14, but it is not limited to this, and the water and oil repellent layer 16 may be formed only on a part of the silicon oxide layer 14.

In the example in FIG. 1, the silicon oxide layer 14 and the water and oil repellent layer 16 are formed only on one side of the substrate 12, but they are not limited to this, and the silicon oxide layer 14 and the water and oil repellent layer 16 may be formed on both sides of the substrate 12.

(Substrate)

The substrate is not particularly limited, so long as it is required to provide water and oil repellency. The material for the substrate may be metal, resin, glass, sapphire, ceramic, stone, or a composite of these materials. Glass may be chemically strengthened.

As the substrate, a substrate for a touch panel, or a substrate for a display, is suitable, and a substrate for a touch panel is particularly suitable. The substrate for a touch panel has light permeability. The term "having light permeability" is meant that the transmittance of perpendicularly incident visible light in accordance with JIS R3106: 1998 (ISO 9050: 1990) is at least 25%. As the material for the substrate for a touch panel, glass and a transparent resin are preferred.

Further, as the substrate, the following examples may be mentioned. Glass or resin to be used in a building material, a decorative building material, an interior good, a transportation equipment (e.g. an automobile), a sign or bulletin board, a drinking vessel or tableware, a water tank, an ornamental equipment (e.g. a frame or box), a laboratory equipment, a furniture, glass or resin to be used for art-sports-games; and glass or resin to be used for an exterior part (excluding the display) in a device such as a mobile phone (e.g. a smartphone), a mobile information terminal, a game console, a remote control, etc., are also preferred.

The shape of the substrate may be in the form of a plate or film.

The substrate may be a substrate, of which one surface or both surfaces may be treated with a surface treatment such as corona discharge treatment, plasma treatment, or plasma graft polymerization treatment. The surface that has undergone surface treatment is more excellent in adhesion between the substrate and the silicon oxide layer, and as a result, the friction resistance of the water and oil repellent layer will be more excellent. Therefore, it is preferred to apply surface treatment to the surface of the substrate in contact with the silicon oxide layer.

Among surface treatments, corona discharge treatment is preferred because it provides better friction resistance of the water and oil repellent layer.

In corona treatment, the degree of surface modification of the substrate tends to vary proportionally to the power input, and therefore, it is preferred to conduct the treatment at the highest possible discharge rate (W·min/m$^2$) depending on the type of the substrate.

(Silicon Oxide Layer)

The silicon oxide layer is a layer containing silicon oxide and alkali metal atoms. From the viewpoint of better friction resistance of the water and oil repellent layer, and from the viewpoint of production efficiency, it is preferred that at least some of the alkali metal atoms are sodium atoms, i.e. the silicon oxide layer contains silicon oxide and sodium atoms. The silicon oxide is preferably a condensation product of silicic acid or a hydrolytic condensation product of an alkoxysilane. It is more preferred that it is a condensation product of silicic acid, because the adhesion between the silicon oxide layer and the water and oil repellent layer will be more excellent, whereby the friction resistance of the water and oil repellent layer will be more excellent.

The silicon oxide in the silicon oxide layer is preferably a vapor deposit of silicon oxide containing alkali metal atoms, since the friction resistance of the water and oil repellent layer will be more excellent.

The thickness of the silicon oxide layer is preferably from 2 to 200 nm, particularly preferably from 2 to 20 nm. When the thickness of the silicon oxide layer is at least the lower limit value, it will be easy to sufficiently obtain improvement in adhesiveness by the silicon oxide layer. When the thickness of the silicon oxide layer is at most the upper limit value, the silicon oxide layer itself will have high friction resistance. The method for measuring the thickness of the silicon oxide layer is not particularly limited, but, for example, there is a method by cross-sectional observation of the silicon oxide layer using an electron microscope (SEM, TEM, etc.) or a method of using an optical interference film thickness meter, a spectroscopic ellipsometer, or a step meter.

In the silicon oxide layer, the average value of the concentration of alkali metal atoms in the region of from 0.1 to 0.3 nm in depth from the surface in contact with the water and oil repellent layer is at least $2.0 \times 10^{19}$ atoms/cm$^3$, preferably at least $5.0 \times 10^{19}$ atoms/cm$^3$, more preferably at least $1.5 \times 10^{20}$ atoms/cm$^3$. When the average value of the concentration of alkali metal atoms is at least the lower limit value, adhesion between the silicon oxide layer and the water and oil repellent layer will be excellent, whereby the friction resistance of the water and oil repellent layer will be excellent.

The concentration of alkali metal atoms refers to the concentration of alkali metal atoms if there is only one type of alkali metal atoms contained in the above region, or the total concentration of alkali metal atoms if there are two or more types of alkali metal atoms contained in the above region.

Therefore, even if there are two or more types of alkali metal atoms contained in the above region and the average value of the concentration of each alkali metal atom is less than the above lower limit, the average value of the total concentration of the respective alkali metal atoms may be at least the above lower limit value.

Specifically, for example, if the alkali metal atoms contained in the above region include Na, and the average value of the concentration of Na atoms in the above region is at least $2.0 \times 10^{19}$ atoms/cm$^3$, the requirement for the concentration of alkali metal atoms in the present invention is satisfied regardless of the presence or absence of alkali metal atoms other than Na. Further, if the alkali metal atoms contained in the above region are Na and K, and the average value of the concentration of Na atoms and the average value of the concentration of K atoms are each less than $2.0 \times 10^{19}$ atoms/cm$^3$ in the above region, if the sum of the average concentration of Na atoms and the average concentration of K atoms is at least $2.0 \times 10^{19}$ atoms/cm$^3$, the requirement for the concentration of alkali metal atoms in the present invention is satisfied.

The upper limit value of the average value of the concentration of alkali metal atoms is not particularly limited, but from the viewpoint of sufficiently forming Si—O—Si bonds in the silicon oxide layer and securing sufficient mechanical properties of the silicon oxide layer, it is preferably $4.0 \times 10^{22}$ atoms/cm$^3$, particularly preferably $1.0 \times 10^{22}$ atoms/cm$^3$.

The average value of the concentration of alkali metal atoms is determined by obtaining the depth direction profile of the concentration of alkali metal atoms by TOF-SIMS (Time-of-Flight Secondary Ion Mass Spectrometry) depth profile analysis by ion sputtering, and then calculating the average value of the concentration of alkali metal atoms in the depth region of from 0.1 to 0.3 nm in the profile.

The TOF-SIMS depth profile analysis by ion sputtering is conducted by alternately repeating the measurement by TOF-SIMS and etching of the surface by ion sputtering using an ion gun built in the TOF-SIMS.

The reason for excluding the concentration of alkali metal atoms in the silicon oxide layer in a region with a depth of less than 0.1 nm from the surface in contact with the water and oil repellent layer is that if the surface of the silicon oxide layer is contaminated with external substances including alkali metal atoms, the contamination by alkali metal atoms will be reflected in the concentration profile of alkali metal atoms in the area, whereby there will be such a worry that the concentration of alkali metal atoms derived from Si—OM in the silicon oxide layer may not accurately be measured.

The surface roughness (Ra) measured by a scanning probe microscope at the surface of the silicon oxide layer (interface with the water and oil repellent layer) is preferably at least 0.5 nm, from the viewpoint of the friction resistance. The upper limit value of the surface roughness is not particularly limited, but 10 nm is preferred.

The silicon oxide layer is not particularly limited, but it is preferably a layer formed on the surface of the substrate by a wet coating method using a coating solution made of a solution containing a silicon oxide precursor, an alkali metal source and a solvent (such as water or a water-soluble organic solvent), or a layer formed on the surface of the substrate by a dry coating method using silicon oxide containing alkali metal atoms. Details of the method for producing the silicon oxide layer are as described later.

(Water and Oil Repellent Layer)

The water and oil repellent layer consists of a hydrolytic condensation product of a fluorinated compound represented by the formula (1). The fluorinated compound represented by the formula (1) is a fluorinated compound having a reactive silyl group, and the reactive silyl group means a hydrolyzable silyl group and a silanol group (Si—OH). A specific example of the hydrolyzable silyl group is a group in which L in the group represented by the formula (1) is a hydrolyzable group.

The hydrolyzable silyl group becomes a silanol group represented by Si—OH by a hydrolysis reaction. Silanol groups further undergo a dehydration-condensation reaction between silanol groups to form a Si—O—Si bond. Further, the silanol group also reacts with the silanol group or OM group (Si—OM) at the surface of the silicon oxide layer to form a chemical bond (Si—O—Si bond). That is, the water and oil repellent layer contains condensation products in which some or all of the reactive silyl groups in the fluorinated compound undergo hydrolysis and dehydration condensation reactions.

The thickness of the water and oil repellent layer is preferably from 1 to 100 nm, particularly preferably from 1 to 50 nm. When the thickness of the water and oil repellent layer is at least the lower limit value, the effect of the water and oil repellent layer can be sufficiently obtained. When the thickness of the water and oil repellent layer is at most the upper limit value, the utilization efficiency will be high.

In the present invention, the thickness obtained by an X-ray diffractometer for thin film analysis is defined as the thickness of the water and oil repellent layer. The thickness of the water and oil repellent layer can be calculated from the oscillation period of an interference pattern by obtaining the interference pattern of the reflective X-rays by the X-ray reflectivity method using an X-ray diffractometer for thin film analysis (ATX-G manufactured by RIGAKU).

The compound (1) is a fluorinated compound represented by the formula (1). As the compound (1), two or more types may be used in combination.

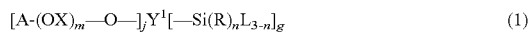 (1)

$(OX)_m$ in the formula (1) is a poly(oxyfluoroalkylene) chain.

X is a fluoroalkylene group having at least one fluorine atom.

The number of carbon atoms in the fluoroalkylene group is preferably from 1 to 6, particularly preferably from 2 to 4, from such a viewpoint that the weatherability and corrosion resistance of the water and oil repellent layer will be more excellent.

The fluoroalkylene group may be linear, branched-chain, or cyclic.

The number of fluorine atoms in linear and branched-chain fluoroalkylene groups is preferably from 1 to 2 times the number of carbon atoms, more preferably from 1.7 to 2 times the number of carbon atoms, from such a viewpoint that the corrosion resistance of the water and oil repellent layer will be more excellent. The number of fluorine atoms in the cyclic fluoroalkylene group is preferably from 1 to 2 times the number of carbon atoms, more preferably from 1.7 to 2 times the number of carbon atoms.

As the fluoroalkylene group, a group in which all the hydrogen atoms in the fluoroalkylene group are replaced with fluorine atoms (a perfluoroalkylene group), is preferred.

As specific examples of (OX), —OCHF—, —OCF$_2$CHF—, —OCHFCF$_2$—, —OCF$_2$CH$_2$—, —OCH$_2$CF$_2$—, —OCF$_2$CF$_2$CHF—, —OCHFCF$_2$CF$_2$—, —OCF$_2$CF$_2$CH$_2$—, —OCH$_2$CF$_2$CF$_2$—, —OCF$_2$CF$_2$CF$_2$CH$_2$—, —OCH$_2$CF$_2$CF$_2$CF$_2$—, —OCF$_2$CF$_2$CF$_2$CF$_2$CH$_2$—, —OCH$_2$CF$_2$CF$_2$CF$_2$CF$_2$—, —OCF$_2$CF$_2$CF$_2$CF$_2$CF$_2$CH$_2$—, —OCH$_2$CF$_2$CF$_2$CF$_2$CF$_2$CF$_2$—, —OCF$_2$—, —OCF$_2$CF$_2$—, —OCF$_2$CF$_2$CF$_2$—, —OCF(CF$_3$)CF$_2$—, —OCF$_2$CF$_2$CF$_2$CF$_2$—, —OCF(CF$_3$)CF$_2$CF$_2$—, —O—CF(CF$_2$CF$_3$)CF$_2$—, —OCF$_2$CF$_2$CF$_2$CF$_2$CF$_2$—, —OCF$_2$CF$_2$CF$_2$CF$_2$CF$_2$CF$_2$—, —O-cycloC$_4$F$_6$—, —O-cycloC$_5$F$_8$— and —O-cycloC$_6$F$_{10}$— may be mentioned.

Here, -cycloC$_4$F$_6$— means a perfluorocyclobutanediyl group, and its example may be a perfluorocyclobutane-1,2-diyl group. -cycloC$_5$F$_8$— means a perfluorocyclopentanediyl group, and its example may be a perfluorocyclopentane-1,2-diyl group. -cycloC$_6$F$_{10}$— means a perfluorocyclohexanediyl group, and its example may be a perfluorocyclohexane-1,4-diyl group.

m is an integer of at least 2, more preferably from 2 to 200, further preferably from 5 to 150, particularly preferably from 5 to 100, most preferably from 10 to 50.

The $(OX)_m$ may contain only one type of (OX), or may contain two or more types of (OX).

The order in which the two or more types of (OX) are bonded is not limited, and they may be arranged randomly, alternately or in blocks.

Containing two or more types of (OX) means that in the compound (1), there are two or more types of (OX) with different number of carbon atoms, two or more types of (OX) with different numbers of hydrogen atoms, two or more types of (OX) with different positions of hydrogen atoms, or two or more types of (OX) with the same number of carbon atoms but different in presence or absence of side chains or different in types of side chains (number of side chains, carbon number of side chains, etc.).

As for the arrangement of two or more types of (OX), for example, the structure represented by {(OCF$_2$)$_{m21}$—OCF$_2$CF$_2$)$_{m22}$} shows that m21 (OCF$_2$) and m22 (OCF$_2$CF$_2$) are randomly arranged. Further, the structure represented by $(OCF_2CF_2-OCF_2CF_2CF_2CF_2)_{m25}$ shows that m25 $(OCF_2CF_2)$ and m25 $(OCF_2CF_2CF_2CF_2)$ are arranged alternately.

As $(OX)_m$,
$[(OCH_{ma}F_{(2-ma)})_{m11} \cdot (OC_2H_{mb}F_{(4-mb)})_{m12} \cdot (OC_3H_{mc}F_{(6-mc)})_{m13} \cdot (OC_4H_{md}F_{(8-md)})_{m14} \cdot (OC_5H_{me}F_{(10-me)})_{m15} \cdot (OC_6H_{mf}F_{(12-mf)})_{m16} \cdot (O\text{-cyclo}C_4H_{mg}F_{(6-mg)})_{m17} \cdot (O\text{-cyclo}C_5H_{mh}F_{(8-mh)})_{m18} \cdot (O\text{-cyclo}CH_{mi}F_{(10-mi)})_{m19}]$ is preferred. Here, -cyclo$C_4H_{mg}F_{(6-mg)}$ represents a fluorocyclobutanediyl group, and a fluorocyclobutane-1,2-diyl group is preferred. -cyclo$C_5H_{mh}F_{(8-mh)}$ represents a fluorocycloheptanediyl group, and a fluorocycloheptane-1,2-diyl group is preferred. -cyclo$C_6H_{mi}F_{(10-mi)}$ represents a fluorocyclohexanediyl group, and a fluorocyclohexane-1,4-diyl group is preferred.

ma is 0 or 1, mb is an integer of from 0 to 3, mc is an integer of from 0 to 5, md is an integer of from 0 and 7, me is an integer of from 0 to 9, mf is an integer of from 0 to 11, mg is an integer of from 0 to 5, mh is an integer of from 0 to 7, and mi is an integer of from 0 to 9.

m11, m12, m13, m14, m15, m16, m17, m18 and m19 are each independently an integer of at least 0, and preferably at most 100.

m11+m12+m13+m14+m15+m16+m17+m18+m19 is an integer of at least 2, preferably from 2 to 200, more preferably from 5 to 150, further preferably from 5 to 100, particularly preferably from 10 to 50.

Among them, m12 is preferably an integer of at least 2, particularly preferably from 2 to 200.

Further, $C_3H_{mc}F_{(6-mc)}$, $C_4H_{md}F_{(8-md)}$, $C_5H_{me}F_{(10-me)}$ and $C_6H_{mf}F_{(12-mf)}$ may be linear or branched chain, and linear is preferred from such a viewpoint that the friction resistance of the water and oil repellent layer will be more excellent.

Further, the order of bonding of m11 $(OCH_{ma}F_{(2-ma)})$, m12 $(OC_2H_{mb}F_{(4-mb)})$, m13 $(OC_3H_{mc}F_{(6-mc)})$, m14 $(OC_4H_{md}F_{(8-md)})$, m15 $(OC_5H_{me}F_{(10-me)})$, m16 $(OC_6H_{mf}F_{(12-mf)})$, m17 $(O\text{-cyclo}C_4H_{mg}F_{(6-mg)})$, m18 $(O\text{-cyclo}C_5H_{mh}F_{(8-mh)})$, m19 $(O\text{-cyclo}C_6H_{mi}F_{(10-mi)})$ is not limited.

If m11 is two or more, the plurality of $(OCH_{ma}F_{(2-ma)})$ may be the same or different.

If m12 is two or more, the plurality of $(OC_2H_{mb}F_{(4-mb)})$ may be the same or different.

If m13 is two or more, the plurality of $(OC_3H_{mc}F_{(6-mc)})$ may be the same or different.

If m14 is two or more, the plurality of $(OC_4H_{md}F_{(8-md)})$ may be the same or different.

If m15 is two or more, the plurality of $(OC_5H_{me}F_{(10-me)})$ may be the same or different.

If m16 is two or more, the plurality of $(OC_6H_{mf}F_{(12-mf)})$ may be the same or different.

If m17 is two or more, the plurality of $(O\text{-cyclo}C_4H_{mg}F_{(6-mg)})$ may be the same or different.

If m18 is two or more, the plurality of $(O\text{-cyclo}C_5H_{mh}F_{(8-mh)})$ may be the same or different.

If m19 is two or more, the plurality of $(O\text{-cyclo}C_6H_{mi}F_{(10-mi)})$ may be the same or different.

$(OX)_m$ is preferably ones having the following structures.
$\{(OCF_2)_{m21} \cdot (OCF_2CF_2)_{m22}\}$,
$(OCF_2CF_2)_{m23}$,
$(OCF(CF_3)CF_2)_{m24}$,
$(OCF(CF_2F_3)CF_2)_{m24}$,
$(OCF_2CF_2CF_2)_{m24}$,
$(OCF(CF_3)CF_2CF_2)_{m24}$,
$(OCF_2CF_2-OCF_2CF_2CF_2CF_2)_{m25}$,
$\{(OCF_2CF_2CF_2CF_2CF_2)_{m26} \cdot (OCF_2)_{m27}\}$,
$\{(OCF_2CF_2CF_2CF_2CF_2)_{m26} \cdot (OCF_2CF_2)_{m27}\}$,
$\{(OCF_2CF_2CF_2CF_2CF_2)_{m26} \cdot (OCF_2)_{m27}\}$,
$\{(OCF_2CF_2CF_2CF_2CF_2)_{m26} \cdot (OCF_2CF_2)_{m27}\}$,
$(OCF_2CF_2CF_2CF_2CF_2-OCF_2)_{m28}$,
$(OCF_2CF_2CF_2CF_2CF_2-OCF_2CF_2)_{m28}$,
$(OCF_2CF_2CF_2CF_2CF_2CF_2-OCF_2)_{m28}$,
$(OCF_2CF_2CF_2CF_2CF_2CF_2-OCF_2CF_2)_{m28}$,
$(OCF_2-OCF_2CF_2CF_2CF_2CF_2)_{m28}$,
$(OCF_2-OCF_2CF_2CF_2CF_2CF_2CF_2)_{m28}$,
$(OCF_2CF_2-OCF_2CF_2CF_2CF_2CF_2)_{m28}$,
$(OCF_2CF_2-OCF_2CF_2CF_2CF_2CF_2CF_2)_{m28}$,
$(OCF(CF_3)CF_2)_{m29}\{(OCF_2)_{m21} \cdot (OCF_2CF_2)_{m22-2}\}$,
$(OCF(CF_3)CF_2)_{m29}(OCF_2CF_2)_{m22-2}$,
$(OCF(CF_3)CF_2)_{m29}-(OCF_2CF_2CF_2)_{m24}$,
$(OCF(CF_3)CF_2CF_2)_{m29}\{(OCF_2)_{m21} \cdot (OCF_2CF_2)_{m22-2}\}$,
$(OCF(CF_3)CF_2CF_2)_{m29}\{(OCF_2CF_2)_{m22-2}\}$,
$(OCF(CF_3)CF_2CF_2)_{m29}-(OCF_2CF_2CF_2)_{m24}$ Here, m21 is an integer of at least 1, m22 is an integer of at least 1, m21+m22 is an integer of from 2 to 500, m23 and m24 are each independently an integer of from 2 to 500, m25 is an integer of from 1 to 250, m26 and m27 are each independently an integer of at least 1, m26+m27 is an integer of from 2 and 500, m28 is an integer of from 1 to 250, m29 is an integer of from 2 to 500, m21+m22+m29 is an integer of from 2 to 500, m22+m29 is an integer of from 2 to 500, and m24+m29 is an integer of from 2 to 500.

Further, as the fluoroalkylene group having a ring structure, for example, groups of the following formulas may be mentioned. Here, * in the formulas represents a bonding hand. Further, they may also be groups in which some of fluorine atoms in the formulas are replaced with hydrogen atoms.

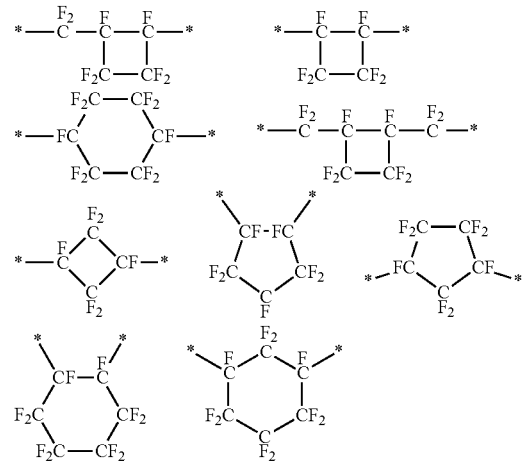

$(OX)_m$ is more preferably the following structures from such a viewpoint that it will be easy to produce a compound (1).
$\{(OCF_2)_{m21} \cdot (OCF_2CF_2)_{m22}\}$,
$(OCF_2CF_2CF_2)_{m24}$,
$(OCF_2CF_2)_2\{(OCF_2)_{m21} \cdot (OCF_2CF_2)_{m22-2}\}$,
$(OCF_2CF_2-OCF_2CF_2CF_2CF_2)_{m25-1}OCF_2CF_2$,
$(OCF_2CF_2CF_2CF_2CF_2-OCF_2)_{m28}$,
$(OCF_2CF_2CF_2CF_2CF_2CF_2-OCF_2)_{m28}$,
$(OCF_2-OCF_2CF_2CF_2CF_2CF_2)_{m28-1}OCF_2CF_2$,
$(OCF_2-OCF_2CF_2CF_2CF_2CF_2CF_2)_{m28-1}OCF_2CF_2$
$(OCF(CF_3)CF_2)_{m29}\{(OCF_2)_{m21} \cdot (OCF_2CF_2)_{m22-2}\}$,
$(OCF(CF_3)CF_2)_{m29}(OCF_2CF_2)_{m22-2}$,
$(OCF(CF_3)CF_2)_{m29}-(OCF_2CF_2CF_2)_{m24}$,
$(OCF(CF_3)CF_2CF_2)_{m29}\{(OCF_2)_{m21} \cdot (OCF_2CF_2)_{m22-2}\}$, $(OCF(CF_3)CF_2CF_2)_{m29}\{(OCF_2CF_2)_{m22\text{-}2}\}$,
$(OCF(CF_3)CF_2CF_2)_{m29}\text{—}(OCF_2CF_2CF_2)_{m24}$ Here, with respect to m22-2, m25-1 and m28-1, the numbers of m22, m25 and m28 are selected so that they become integers of at least 1.

Among these, $(OX)_m$ is preferably $\{(OCF_2)_{m21}\cdot(OCF_2CF_2)_{m22}\}$ from such a viewpoint that the friction resistance of the water and oil repellent layer will be more excellent.

In $\{(OCF_2)_{m21}\cdot(OCF_2CF_2)_{m22}\}$, m22/m21 is preferably from 0.1 to 10, more preferably from 0.2 to 5.0, further preferably from 0.2 to 2.0, particularly preferably from 0.2 to 1.5, most preferably from 0.2 to 0.85, from such a viewpoint that the friction resistance and fingerprint smudge removability of the water and oil repellent layer will be more excellent.

The number average molecular weight of $(OX)_m$ is preferably from 1,000 to 20,000, more preferably from 2,000 to 15,000, particularly preferably from 3,000 to 10,000.

When the number average molecular weight is at least the lower limit value, the molecular chain of the compound (1) becomes longer, whereby the flexibility of the molecular chain of the compound (1) will be improved. This increases the reaction probability between the silanol groups derived from the reactive silyl groups of the compound (1) and the silanol groups or Si—OM of the silicon oxide layer, whereby the adhesion between the water and oil repellent layer and the silicon oxide layer will be further improved. As a result, the friction resistance of the water and oil repellent layer will be further excellent. Further, since the fluorine content of the water and oil repellent layer is increased, the water and oil repellency will be further excellent.

Further, when the number average molecular weight is at most the upper limit value, the handling performance during film deposition will be further excellent.

R is a monovalent hydrocarbon group, preferably a monovalent saturated hydrocarbon group. The number of carbon atoms in R is preferably from 1 to 6, more preferably from 1 to 3, particularly preferably from 1 to 2.

L is a hydrolyzable group or a hydroxy group.

The hydrolyzable group of L is a group that becomes a hydroxy group by a hydrolysis reaction. That is, a silyl group having a hydrolyzability represented by Si-L becomes a silanol group represented by Si—OH by a hydrolysis reaction. The silanol group further reacts with another silanol group to form a Si—O—Si bond. Further, the silanol group can also form a Si—O—Si bond through a dehydration condensation reaction with a silanol group derived from an oxide in the silicon oxide layer.

Specific examples of L as a hydrolyzable group, include an alkoxy group, an aryloxy group, a halogen atom, an acyl group, an acyloxy group and an isocyanate group (—NCO). As the alkoxy group, a $C_{1\text{-}4}$ alkoxy group is preferred. As the aryloxy group, a $C_{3\text{-}10}$ aryloxy group is preferred. As the halogen atom, a chlorine atom is preferred. As the acyl group, a $C_{1\text{-}6}$ acyl group is preferred. As the acyloxy group, a $C_{1\text{-}6}$ acyloxy group is preferred.

As L, a $C_{1\text{-}4}$ alkoxy group and a halogen atom are preferred from such a viewpoint that the production of the compound (1) will be easier. As L, a $C_{1\text{-}4}$ alkoxy group is preferred from such a viewpoint that outgassing will be less during coating, and the storage stability of the compound (1) will be better, an ethoxy group is particularly preferred when long-term storage stability of the compound (1) is required, and a methoxy group is particularly preferred when the reaction time after application is required to be short.

n is an integer of from 0 to 2.

n is preferably 0 or 1, particularly preferably 0. By the presence of a plurality of L, the adhesion of the water and oil repellent layer to the silicon oxide layer becomes stronger.

When n is 0 or 1, the plurality of L present in one molecule may be the same or different. It is preferred that they are the same from the viewpoint of ease of obtaining raw materials and ease of producing the compound (1). When n is 2, the plurality of R present in one molecule may be the same or different, but it is preferred that they are the same from the viewpoint of ease of obtaining raw materials and ease of producing the compound (1).

A is a perfluoroalkyl group or $\text{—}Y^2[\text{—}Si(R)_nL_{3\text{-}n}]_k$.

The number of carbon atoms in the perfluoroalkyl group is preferably from 1 to 20, more preferably from 1 to 10, further preferably from 1 to 6, particularly preferably from 1 to 3, from such a viewpoint that the friction resistance of the water and oil repellent layer will be more excellent.

The perfluoroalkyl group may be linear, branched-chain or cyclic.

However, when A is $\text{—}Y^2[\text{—}Si(R)_nL_{3\text{-}n}]_k$, j is 1. Further, when A is a perfluoroalkyl group and j is 1, g is an integer of at least 2. That is, the compound (1) is a compound having two or more reactive silyl groups ($\text{—}Si(R)_nL_{3\text{-}n}$).

As the perfluoroalkyl group, $CF_3$—, $CF_3CF_2$—, $CF_3CF_2CF_2$—, $CF_3CF_2CF_2CF_2$—, $CF_3CF_2CF_2CF_2CF_2$—, $CF_3CF_2CF_2CF_2CF_2CF_2$—, $CF_3CF(CF_3)$—, etc. may be mentioned.

As the perfluoroalkyl group, $CF_3$—, $CF_3CF_2$— or $CF_3CF_2CF_2$— is preferred from such a viewpoint that the water and oil repellency of the water and oil repellent layer will be more excellent.

A may be a fluoroalkyl group having a ring structure (also referred to as a fluorocycloalkyl group). The number of carbon atoms is preferably from 3 to 20, more preferably from 4 to 8, particularly preferably from 4 to 6. As the fluoroalkyl group having a ring structure, for example, groups of the following formulas may be mentioned. Here, * in the formulas represents a bonding hand.

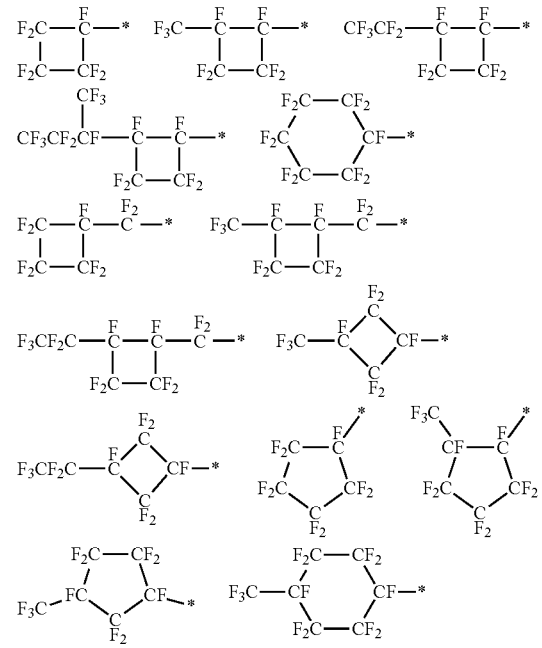

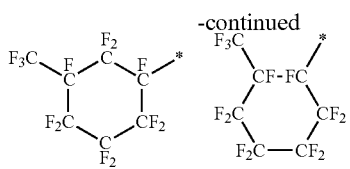

Y² is a (k+1) valent linking group.

Y² may be any group that does not impair the effect of the present invention, and for example, an alkylene group which may have an etheric oxygen atom or a divalent organopolysiloxane residue, a carbon atom, a nitrogen atom, a silicon atom, a 2 to 8 valent organopolysiloxane residue, groups (g2-1) to (g2-9) and groups (g3-1) to (g3-9) as described later, may be mentioned.

Y¹ is a (j+g) valent linking group.

Y¹ may be any group that does not impair the effect of the invention, and for example, an alkylene group which may have an etheric oxygen atom or a divalent organopolysiloxane residue, a carbon atom, a nitrogen atom, a silicon atom, a 2 to 8 valent organopolysiloxane residue, and groups (g2-1) to (g2-9) and groups (g3-1) to (g3-9) as described later, may be mentioned.

j is an integer of at least 1, and from such a viewpoint that the water and oil repellency of the water and oil repellent layer will be more excellent, from 1 to 6 is preferred, and from such a viewpoint that it will be easy to produce the compound (1), 1 is particularly preferred.

g is an integer of at least 1, and from such a viewpoint that the friction resistance of the water and oil repellent layer will be more excellent, from 1 to 15 is preferred, from 1 to 8 is more preferred, from 2 to 6 is further preferred, 2 or 3 is particularly preferred, and 3 is most preferred. However, as mentioned above, when A is a perfluoroalkyl group and j is 1, g is an integer of at least 2.

k is an integer of at least 1, and from such a viewpoint that the friction resistance of the water and oil repellent layer will be more excellent, from 1 to 15 is preferred, from 1 to 8 is more preferred, and from 2 to 6 is particularly preferred.

From such a viewpoint that the friction resistance of the water and oil repellent layer will be more excellent, k+g is preferably from 2 to 30, more preferably from 2 to 20, further preferably from 3 to 18, particularly preferably from 4 to 15.

When the compound (1) has a plurality of [—Si(R)$_n$L$_{3-n}$], the plurality of [—Si(R)$_n$L$_{3-n}$] may be the same or different.

The compound (1) is preferably compound (1-1), compound (1-2) and compound (1-3), from such a viewpoint that the initial water contact angle and friction resistance of the water and oil repellent layer will be more excellent. Among them, compound (1-1) and compound (1-2) are particularly excellent in the initial water contact angle of the water and oil repellent layer, and compound (1-3) is particularly excellent in the friction resistance of the water and oil repellent layer.

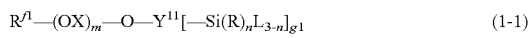

(1-1)

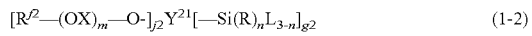

(1-2)

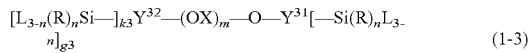

(1-3)

In the formula (1-1), X, m, R, n and L are respectively the same as the definitions of X, m, R, n and L in the formula (1).

R$^{f1}$ is a perfluoroalkyl group, and suitable forms and specific examples of the perfluoroalkyl group are described above.

Y$^{11}$ is a (g1+1) valent linking group, and its specific examples are the same as Y¹ in the formula (1).

g1 is an integer of at least 2, and from such a viewpoint that the friction resistance of the water and oil repellent layer will be more excellent, an integer of from 2 to 15 is preferred, from 2 to 4 is more preferred, 2 or 3 is further preferred, and 3 is particularly preferred.

In the formula (1-2), X, m, R, n and L are respectively the same as the definitions of X, m, R, n and L in the formula (1).

R$^{f2}$ is a perfluoroalkyl group, and suitable forms and specific examples of the perfluoroalkyl group are described above.

j2 is an integer of at least 2, preferably from 2 to 6, more preferably from 2 to 4.

Y$^{21}$ is a (j2+g2) valent linking group, and its specific examples are the same as Y¹ in the formula (1).

g2 is an integer of at least 2, and from such a viewpoint that the friction resistance of the water and oil repellent layer will be more excellent, from 2 to 15 is preferred, from 2 to 6 is more preferred, from 2 to 4 is further preferred, and 4 is particularly preferred.

In the formula (1-3), X, m, R, n and L are respectively the same as the definitions of X, m, R, n and L in the formula (1).

k3 is an integer of at least 1, preferably from 1 to 4, more preferably 2 or 3, particularly preferably 3.

Y$^{32}$ is a (k3+1) valent linking group, and its specific examples are the same as Y² in the formula (1).

Y$^{31}$ is a (g3+1) valent linking group, and its specific examples are the same as Y¹ in the formula (1).

g3 is an integer of at least 1, preferably from 1 to 4, more preferably 2 or 3, particularly preferably 3.

Y$^{11}$ in the formula (1-1) may be the group (g2-1) (provided d1+d3=1 (i.e. d1 or d3 is 0), g1=d2+d4, d2+d4≥2), the group (g2-2) (provided e1=1, g1=e2, e2≥2), the group (g2-3) (provided g1=2), the group (g2-4) (provided h1=1, g1=h2, h2≥2), the group (g2-5) (provided i1=1, g1=i2, i2≥2), the group (g2-7) (provided g1=i3+1), the group (g2-8) (provided g1=i4, i4≥2), or the group (g2-9) (provided g1=i5, i5≥2).

Y$^{21}$ in the formula (1-2) may be the group (g2-1) (provided j2=d1+d3, d1+d3≥2, g2=d2+d4, d2+d4≥2), the group (g2-2) (provided j2=e1, e1=2, g2=e2, e2=2), the group (g2-4) (provided j2=h1, h1≥2, g2=h2, h2≥2), or the group (g2-5) (provided j2=i1, i1=2, g2=i2, i2=2).

Further, Y$^{31}$ and Y$^{32}$ in the formula (1-3) may be each independently the group (g2-1) (provided g3=d2+d4, k3=d2+d4), the group (g2-2) (provided g3=e2, k3=e2), the group (g2-3) (provided g3=2, k3=2), the group (g2-4) (provided g3=h2, k3=h2), the group (g2-5) (provided g3=i2, k3=i2), the group (g2-6) (provided g3=1, k3=1), the group (g2-7) (provided g3=i3+1, k3=i3+1), the group (g2-8) (provided g3=i4, k3=i4), or the group (g2-9) (provided g3=i5, k3=i5).

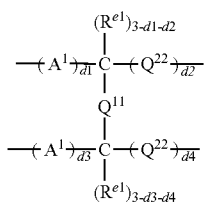 (g2-1)

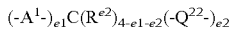 (g2-2)

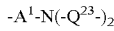 (g2-3)

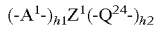 (g2-4)

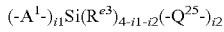 (g2-5)

 (g2-6)

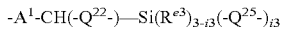 (g2-7)

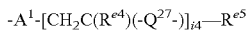 (g2-8)

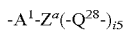 (g2-9)

Here, in the formula (g2-1) to the formula (g2-9), the $A^1$ side is connected to $(OX)_m$, and $Q^{22}$, $Q^{23}$, $Q^{24}$, $Q^{25}$, $Q^{26}$, $Q^{27}$ and $Q^{28}$ sides are connected to $[—Si(R)_nL_{3-n}]$.

$A^1$ is a single bond, an alkylene group, or a group having —C(O)—, —C(O)O—, —OC(O)O—, —OC(O)O—, —C(O)NR$^6$—, —NR$^6$C(O)—, —NHC(O)O—, —NHC(O)NR$^6$—, —O— or —SO$_2$NR$^6$— between carbon-carbon atoms of an alkylene group with two or more carbon atoms, and if two or more A1 are present in each formula, the two or more A1 may be the same or different. The hydrogen atoms in the alkylene group may be replaced by fluorine atoms.

$Q^{22}$ is an alkylene group, a group having —C(O)NR$^6$—, —C(O)—, —NR$^6$— or —O— between carbon-carbon atoms of an alkylene group with two or more carbon atoms, a group having —C(O)NR$^6$—, —C(O)—, —NR$^6$— or —O— at the terminal of an alkylene group not connected to Si, or a group having —C(O)NR$^6$—, —C(O)—, —NR$^6$— or —O— between carbon-carbon atoms of an alkylene group with two or more carbons and having —C(O)NR$^6$—, —NR$^6$C(O)—, —C(O)—, —C(O)O—, —OC(O)—, —NR$^6$— or —O— at the terminal not connected to Si, and in each formula, if two or more $Q^{22}$ are present, the two or more $Q^{22}$ may be the same or different.

$Q^{23}$ is an alkylene group, or a group having —C(O)NR$^6$—, —C(O)—, —NR$^6$— or —O— between carbon-carbon atoms of an alkylene group having two or more carbon atoms, and the two $Q^{23}$ may be the same or different.

$Q^{24}$ is $Q^{22}$ if the atom in $Z^1$ to which $Q^{24}$ is bonded is a carbon atom, and is $Q^{23}$ if the atom in $Z^1$ to which $Q^{24}$ is bonded is a nitrogen atom, and in each formula, if two or more $Q^{24}$ exist, the two or more $Q^{24}$ may be the same or different.

$Q^{25}$ is an alkylene group, or a group having —C(O)NR$^6$—, —C(O)—, —NR$^6$— or —O— between carbon-carbon atoms of an alkylene group with two or more carbon atoms, and in each formula, if two or more $Q^{25}$ exist, the two or more $Q^{25}$ may be the same or different.

$Q^{26}$ is an alkylene group, or a group having —C(O)NR$^6$—, —C(O)—, —NR$^6$— or —O— between carbon-carbon atoms of an alkylene group with two or more carbon atoms.

$R^6$ is a hydrogen atom, a $C_{1-6}$ alkyl group, or a phenyl group.

$Q^{27}$ is a single bond or an alkylene group.

$Q^{28}$ is an alkylene group, or a group having an etheric oxygen atom or a divalent organopolysiloxane residue between carbon-carbon atoms in an alkylene group with two or more carbon atoms.

$Z^1$ is a group having a h1+h2 valent ring structure which has a carbon or nitrogen atom to which $A^1$ is directly bonded and has a carbon or nitrogen atom to which $Q^{24}$ is directly bonded.

$R^{e1}$ is a hydrogen atom or an alkyl group, and in each formula, if two or more $R^{e1}$ is present, the two or more $R^{e1}$ may be the same or different.

$R^{e2}$ is a hydrogen atom, a hydroxy group, an alkyl group, or an acyloxy group.

$R^{e3}$ is an alkyl group.

$R^{e4}$ is a hydrogen atom or an alkyl group, and is preferably a hydrogen atom from such a viewpoint that it will be easy to produce the compound. In each formula, if two or more $R^{e4}$ are present, the two or more $R^{e4}$ may be the same or different.

$R^{e5}$ is a hydrogen atom or a halogen atom, and is preferably a hydrogen atom from such a viewpoint that it will be easy to produce the compound.

d1 is an integer of from 0 to 3, preferably 1 or 2. d2 is an integer of from 0 to 3, preferably 1 or 2. d1+d2 is an integer of from 1 to 3.

d3 is an integer of from 0 to 3, preferably 0 or 1. d4 is an integer of from 0 to 3, preferably 2 or 3. d3+d4 is an integer of from 1 to 3.

d1+d3 is an integer of from 1 to 5, preferably 1 or 2, in $Y^{11}$ or $Y^{21}$, and is 1 in $Y^{11}$, $Y^{31}$ and $Y^{32}$.

d2+d4 is an integer of from 2 to 5, preferably 4 or 5, in $Y^{11}$ or $Y^{21}$, and is an integer of from 3 to 5, preferably 4 or 5, in $Y^{31}$ and $Y^{32}$.

e1+e2 is 3 or 4. e1 is 1 in $Y^{11}$, is an integer of from 2 to 3 in $Y^{21}$, and 1 in $Y^{31}$ and $Y^{32}$. e2 is 2 or 3 in $Y^{11}$ or $Y^{21}$, and is 2 or 3 in $Y^{31}$ and $Y^{32}$.

h1 is 1 in $Y^{11}$, is an integer of at least 2 (preferably 2) in $Y^{21}$, and is 1 in $Y^{31}$ and $Y^{32}$. h2 is an integer of at least 2 (preferably 2 or 3) in $Y^{11}$ or $Y^{21}$, and is an integer of at least 1 (preferably 2 or 3) in $Y^{31}$ and $Y^{32}$.

i1+i2 is 3 or 4 in $Y^{11}$, is 4 in $Y^{12}$, and is 3 or 4 in $Y^{31}$ and $Y^{32}$. i1 is 1 in $Y^{11}$, is 2 in $Y^{21}$, and is 1 in $Y^{31}$ and $Y^{32}$. i2 is 2 or 3 in $Y^{11}$, is 2 in $Y^{12}$, and is 2 or 3 in $Y^{31}$ and $Y^{32}$.

i3 is 2 or 3.

i4 is an integer of at least 2 (preferably from 2 to 10, particularly preferably from 2 to 6) in $Y^{11}$, and is an integer of at least 1 (preferably from 1 to 10, particularly preferably from 1 to 6) in $Y^{31}$ and $Y^{32}$.

i5 is an integer of from 2 to 7.

The number of carbon atoms in the alkylene group of $Q^{22}$, $Q^{23}$, $Q^{24}$, $Q^{25}$, $Q^{26}$, $Q^{27}$, $Q^2$ is preferably from 1 to 10, more preferably from 1 to 6, particularly preferably from 1 to 4, from such a viewpoint that it will be easy to produce the compound (1-1), the compound (1-2) and the compound (1-3) and from such a viewpoint that the friction resistance, light resistance and chemical resistance of the water and oil repellent layer will be more excellent. However, the lower limit value of the number of carbon atoms in the alkylene group in the case of having a specific bond between carbon-carbon atoms, is 2.

As the ring structure in $Z^1$, the above-described ring structure may be mentioned, and the preferred form is also the same. Further, since $A^1$ and $Q^{24}$ are directly bonded to the ring structure in $Z^1$, for example, there will be no possibility that an alkylene group is connected to the ring structure, and $A^1$ and $Q^{24}$ are connected to such an alkylene group.

$Z^a$ is a (i5+1) valent organopolysiloxane residue, and the following groups are preferred. Here, $R^a$ in the following formulas is an alkyl group (preferably one with from 1 to 10 carbon atoms) or a phenyl group.

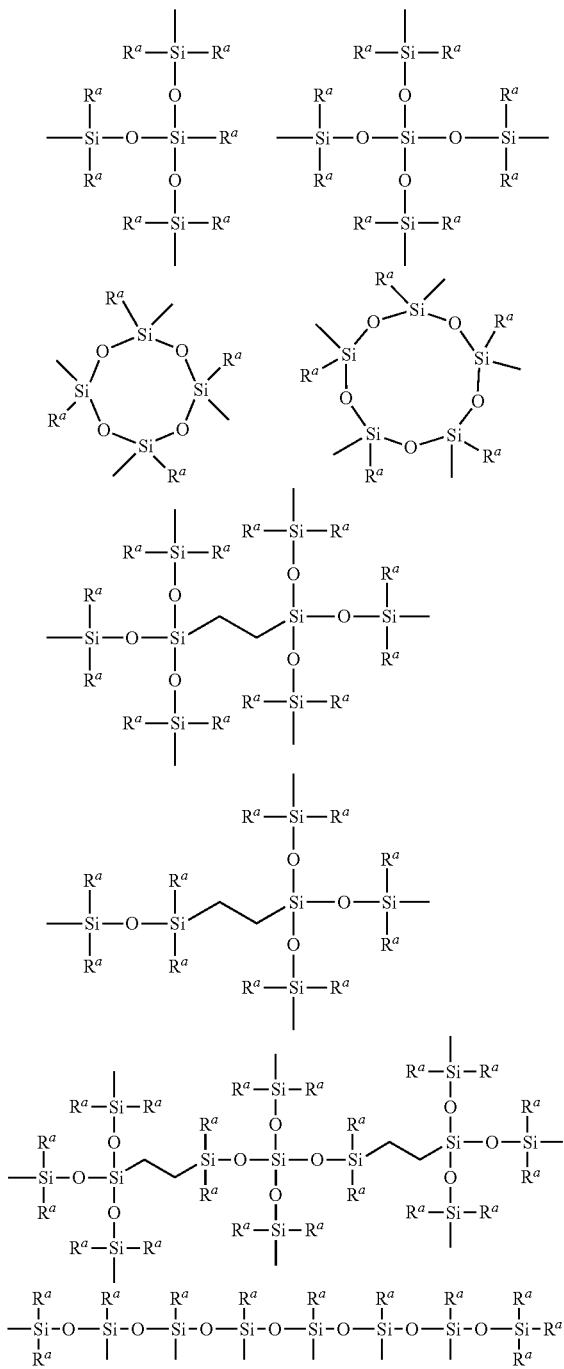

The number of carbon atoms in the alkyl group of $R^{e1}$, $R^{e2}$, $R^{e3}$ or $R^{e4}$ is preferably from 1 to 10, more preferably from 1 to 6, further preferably from 1 to 3, particularly preferably from 1 to 2, from such a viewpoint that it will be easy to produce the compound (1-1), the compound (1-2) and the compound (1-3).

The number of carbon atoms in the alkyl group portion of the acyloxy group of $R^{e2}$ is preferably from 1 to 10, more preferably from 1 to 6, further preferably 1 to 3, particularly preferably from 1 to 2, from such a viewpoint that it will be easy to produce the compound (1).

h1 is preferably from 1 to 6, more preferably from 1 to 4, further preferably 1 or 2, particularly preferably 1, from such a viewpoint that it will be easy to produce the compound (1-1), the compound (1-2) and the compound (1-3), and from such a viewpoint that the friction resistance and fingerprint smudge removability of the water- and oil repellent layer will be more excellent.

h2 is preferably from 2 to 6, preferably from 2 to 4, particularly preferably 2 or 3 from such a viewpoint that it will be easy to produce the compound (1-1), the compound (1-2) and the compound (1-3), and from such a viewpoint that the friction resistance and fingerprint smudge removability of the water and oil repellent layer will be more excellent.

As other forms of $Y^{11}$, the group (g3-1) (provided d1+d3=1 (i.e. d1 or d3 is 0), g1=d2×r1+d4×r1), the group (g3-2) (provided e1=1, g1=e2×r1), the group (g3-3) (provided g1=2×r1), the group (g3-4) (provided h1=1, g1=h2×r1), the group (g3-5) (provided i1=1, g1=i2×r1), the group (g3-6) (provided g1=r1), the group (g3-7) (provided g1=r1×(i3+1)), the group (g3-8) (provided g1=r1×i4), and the group (g3-9) (provided g1=r1×i5) may be mentioned.

As other forms of $Y^{21}$, the group (g3-1) (provided j2=d1+d3, d1+d322, g2=d2×r1+d4×r1), the group (g3-2), (provided j2=e1, e1=2, g2=e2×r1, e2=2), the group (g3-4) (provided j2=h1, h1≥2, g2=h2×r1), and the group (g3-5) (provided j2=i1, i1 is 2 or 3, g2=i2×r1, i1+i2 is 3 or 4) may be mentioned. As other forms of $Y^{31}$ and $Y^{32}$, the group (g3-1) (provided g3=d2×r1+d4×r1, k3=d2×r1+d4×r1), the group (g3-2) (provided g3=e2×r1, k3=e2×r1), the group (g3-3) (provided g3=2×r1, k3=2×r1), the group (g3-4) (provided g3=h2×r1, k3=h2×r1), the group (g3-5) (provided g3=i2×r1, k3=i2×r1), the group (g3-6) (provided g3=r1, k3=r1), the group (g3-7) (provided g3=r1×(i3+1), k3=r1×(i3+1)), the group (g3-8) (provided g3=r1×i4, k3=r1×i4), and the group (g3-9) (provided g3=r1×i5, k3=r1×i5) may be mentioned.

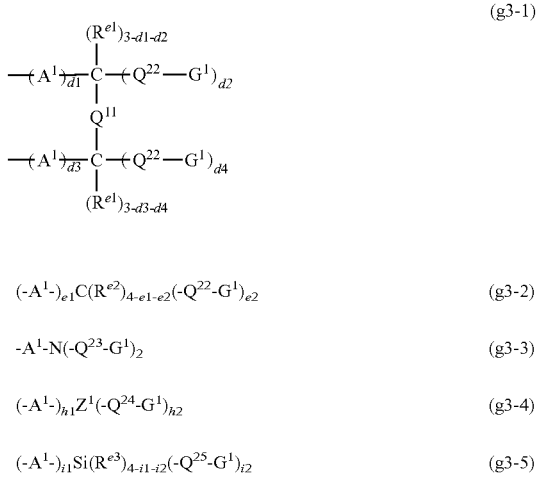

$$(-A^1-)_{e1}C(R^{e2})_{4-e1-e2}(-Q^{22}-G^1)_{e2} \qquad (g3-2)$$

$$-A^1-N(-Q^{23}-G^1)_2 \qquad (g3-3)$$

$$(-A^1-)_{h1}Z^1(-Q^{24}-G^1)_{h2} \qquad (g3-4)$$

$$(-A^1-)_{i1}Si(R^{e3})_{4-i1-i2}(-Q^{25}-G^1)_{i2} \qquad (g3-5)$$

-A$^1$-Q$^{26}$-G$^1$ (g3-6)

-A$^1$-CH(-Q$^{22}$-G$^1$)—Si(R$^{e3}$)$_{3-i3}$(-Q$^{25}$-G$^1$)$_{i3}$ (g3-7)

-A$^1$-[CH$_2$C(R$^{e4}$)(-Q$^{27}$-G)$^1$]$_{i4}$—R$^{e5}$ (g3-8)

-A$^1$-Z$^a$(-Q$^{28}$-G$^1$)$_{i5}$ (g3-9)

Here, in the formulas (g3-1) to (g3-9), the A$^1$ side is connected to (OX)$_m$ and the G$^1$ side is connected to [—Si(R)$_n$L$_{3-n}$].

G$^1$ is the group (g3), and in each formula, if two or more G$^1$ are present, the two or more G$^1$ may be the same or different. The symbols other than G$^1$ are the same as in the formulas (g2-1) to (g2-9).

—Si(R$^8$)$_{3-r1}$(-Q$^3$-)$_{r1}$ (g3)

Here, in the formula (g3), the Si side is connected to Q$^{22}$, Q$^{23}$, Q$^{24}$, Q$^{25}$, Q$^{26}$, Q$^{27}$ and Q$^{28}$, and the Q$^3$ side is connected to [—Si(R)$_n$L$_{3-n}$]. R$^8$ is an alkyl group. Q$^3$ is an alkylene group, a group having —C(O)NR$^6$—, —C(O)—, —NR$^6$— or —O— between carbon-carbon atoms in an alkylene group with two or more carbon atoms, or —(OSi(R$^9$)$_2$)$_p$—O—, and the two or more Q$^3$ may be the same or different. r1 is 2 or 3. R$^6$ is a hydrogen atom, a C$_{1-6}$ alkyl group or a phenyl group. R$^9$ is an alkyl group, a phenyl group or an alkoxy group, and the two R$^9$ may be the same or different. p is an integer of from 0 to 5, and when p is 2 or more, the two or more (OSi(R$^9$)$_2$) may be the same or different.

The number of carbon atoms in the alkylene group of Q$^3$ is preferably from 1 to 10, more preferably from 1 to 6, particularly preferably from 1 to 4, from such a viewpoint that it will be easy to produce the compound (1-1), the compound (1-2) and the compound (1-3), and from such a viewpoint that the friction resistance, light resistance and chemical resistance of the water and oil repellent layer will be more excellent. However, the lower limit value of the number of carbon atoms in the alkylene group in the case of having a specific bond between carbon-carbon atoms, is 2.

The number of carbon atoms in the alkyl group of R$^8$ is preferably from 1 to 10, more preferably from 1 to 6, further preferably from 1 to 3, particularly preferably from 1 to 2, from such a viewpoint that it will be easy to produce the compound (1-1), the compound (1-2) and the compound (1-3).

The number of carbon atoms in the alkyl group of R$^9$ is preferably from 1 to 10, more preferably from 1 to 6, further preferably from 1 to 3, particularly preferably from 1 to 2, from such a viewpoint that it will be easy to produce the compound (1-1), the compound (1-2) and the compound (1-3).

The number of carbon atoms in the alkoxy group of R$^9$ is preferably from 1 to 10, more preferably from 1 to 6, further preferably from 1 to 3, particularly preferably from 1 to 2, from such a viewpoint that the storage stability of the compound (1-1), the compound (1-2) and the compound (1-3) will be excellent.

p is preferably 0 or 1.

As the compound (1-1), the compound (1-2) or the compound (1-3), for example, compounds of the following formulas may be mentioned. The compounds of the following formulas are industrially easy to produce, easy to handle and superior in water and oil repellency, friction resistance, fingerprint smudge removability, lubricity, chemical resistance, light resistance and chemical resistance of the water and oil repellent layer, and among them, the light resistance is particularly superior. R$^f$ in the compounds of the following formulas is the same as R$^{f1}$—(OX)$_m$—O— in the above formula (1-1) or R$^{f2}$—(OX)$_m$—O— in the formula (1-2), and the preferred forms are also the same. Q in the following compounds is the same as —(OX)$_m$—O— in the formula (1-3), and the preferred forms are also the same.

As specifically suitable R$^f$, the following may be exemplified.

CF$_3$—{(OCF$_2$)$_{m21}$·(OCF$_2$CF$_2$)$_{m22}$}
CF$_3$CF$_2$—{(OCF$_2$)$_{m21}$·(OCF$_2$CF$_2$)$_{m22}$}
CF$_3$CF$_2$CF$_2$—{(OCF$_2$)$_{m21}$·(OCF$_2$CF$_2$)$_{m22}$}
CF$_3$CF$_2$CF$_2$CF$_2$—{(OCF$_2$)$_{m21}$·(OCF$_2$CF$_2$)$_{m22}$}
CF$_3$CF$_2$CF$_2$CF$_2$CF$_2$—{(OCF$_2$)$_{m21}$·(OCF$_2$CF$_2$)$_{m22}$}
CF$_3$CF$_2$CF$_2$CF$_2$CF$_2$CF$_2$—{(OCF$_2$)$_{m21}$·(OCF$_2$CF$_2$)$_{m22}$}
CF$_3$CF(CF$_3$)—{(OCF$_2$)$_{m21}$·(OCF$_2$CF$_2$)$_{m22}$}
F-cycloC$_4$F$_6$—{(OCF$_2$)$_{m21}$·(OCF$_2$CF$_2$)$_{m22}$}
F-cycloC$_6$F$_{10}$—{(OCF$_2$)$_{m21}$·(OCF$_2$CF$_2$)$_{m22}$}
CF$_3$—(OCF$_2$CF$_2$CF$_2$)$_{m24}$
CF$_3$CF$_2$—(OCF$_2$CF$_2$CF$_2$)$_{m24}$
CF$_3$CF$_2$CF$_2$—(OCF$_2$CF$_2$CF$_2$)$_{m24}$
CF$_3$CF$_2$CF$_2$CF$_2$—(OCF$_2$CF$_2$CF$_2$)$_{m24}$
CF$_3$CF$_2$CF$_2$CF$_2$CF$_2$—(OCF$_2$CF$_2$CF$_2$)$_{m24}$
CF$_3$CF$_2$CF$_2$CF$_2$CF$_2$CF$_2$—(OCF$_2$CF$_2$CF$_2$)$_{m24}$
CF$_3$CF(CF$_3$)—(OCF$_2$CF$_2$CF$_2$)$_{m24}$
F-cycloC$_4$F$_6$—(OCF$_2$CF$_2$CF$_2$)$_{m24}$
F-cycloC$_6$F$_{10}$—(OCF$_2$CF$_2$CF$_2$)$_{m24}$
CF$_3$—(OCF$_2$CF$_2$)$_2${(OCF$_2$)$_{m21}$·(OCF$_2$CF$_2$)$_{m22-2}$}
CF$_3$CF$_2$—(OCF$_2$CF$_2$)$_2${(OCF$_2$)$_{m21}$·(OCF$_2$CF$_2$)$_{m22-2}$}
CF$_3$CF$_2$CF$_2$—(OCF$_2$CF$_2$)$_2${(OCF$_2$)$_{m21}$·(OCF$_2$CF$_2$)$_{m22-2}$}
CF$_3$CF$_2$CF$_2$CF$_2$—(OCF$_2$CF$_2$)$_2${(OCF$_2$)$_{m21}$·(OCF$_2$CF$_2$)$_{m22-2}$}
CF$_3$CF$_2$CF$_2$CF$_2$CF$_2$—(OCF$_2$CF$_2$)$_2${(OCF$_2$)$_{m21}$·(OCF$_2$CF$_2$)$_{m22-2}$}
CF$_3$CF$_2$CF$_2$CF$_2$CF$_2$CF$_2$—(OCF$_2$CF$_2$)$_2${(OCF$_2$)$_{m21}$·(OCF$_2$CF$_2$)$_{m22-2}$}
CF$_3$CF(CF$_3$)—(OCF$_2$CF$_2$)$_2${(OCF$_2$)$_{m21}$·(OCF$_2$CF$_2$)$_{m22-2}$}
F-cyclo$_4$F$_6$—(OCF$_2$CF$_2$)$_2$((OCF$_2$)$_{m21}$·(OCF$_2$CF$_2$)$_{m22-2}$)
F-cycloC$_6$F$_{10}$—(OCF$_2$CF$_2$)$_2${(OCF$_2$)$_{m21}$·(OCF$_2$CF$_2$)$_{m22-2}$}
CF$_3$—(OCF$_2$CF$_2$—OCF$_2$CF$_2$CF$_2$CF$_2$)$_{m25-1}$OCF$_2$CF$_2$
CF$_3$CF$_2$—(OCF$_2$CF$_2$—OCF$_2$CF$_2$CF$_2$CF$_2$)$_{m25-1}$OCF$_2$CF$_2$
CF$_3$CF$_2$CF$_2$—(OCF$_2$CF$_2$—OCF$_2$CF$_2$CF$_2$CF$_2$)$_{m25-1}$OCF$_2$CF$_2$
CF$_3$CF$_2$CF$_2$CF$_2$—(OCF$_2$CF$_2$—OCF$_2$CF$_2$CF$_2$CF$_2$)$_{m25-1}$OCF$_2$CF$_2$
CF$_3$CF$_2$CF$_2$CF$_2$CF$_2$—(OCF$_2$CF$_2$—OCF$_2$CF$_2$CF$_2$CF$_2$)$_{m25-1}$OCF$_2$CF$_2$
CF$_3$CF$_2$CF$_2$CF$_2$CF$_2$CF$_2$—(OCF$_2$CF$_2$—OCF$_2$CF$_2$CF$_2$CF$_2$)$_{m25-1}$OCF$_2$CF$_2$
CF$_3$CF(CF$_3$)—(OCF$_2$CF$_2$—OCF$_2$CF$_2$CF$_2$CF$_2$)$_{m25-1}$OCF$_2$CF$_2$
F-cycloC$_4$F$_6$—(OCF$_2$CF$_2$—OCF$_2$CF$_2$CF$_2$CF$_2$)$_{m25-1}$OCF$_2$CF$_2$
F-cycloC$_6$F$_{10}$—(OCF$_2$CF$_2$—OCF$_2$CF$_2$CF$_2$CF$_2$)$_{m25-1}$OCF$_2$CF$_2$
CF$_3$—(OCF$_2$CF$_2$—OCF$_2$CF$_2$CF$_2$CF$_2$CF$_2$)$_{m28-1}$OCF$_2$CF$_2$
CF$_3$CF$_2$—(OCF$_2$CF$_2$—OCF$_2$CF$_2$CF$_2$CF$_2$CF$_2$)$_{m28-1}$OCF$_2$CF$_2$
CF$_3$CF$_2$CF$_2$—(OCF$_2$CF$_2$—OCF$_2$CF$_2$CF$_2$CF$_2$CF$_2$)$_{m28-1}$OCF$_2$CF$_2$
CF$_3$CF$_2$CF$_2$CF$_2$—(OCF$_2$CF$_2$—OCF$_2$CF$_2$CF$_2$CF$_2$CF$_2$)$_{m28-1}$OCF$_2$CF$_2$
CF$_3$CF$_2$CF$_2$CF$_2$CF$_2$—(OCF$_2$CF$_2$—OCF$_2$CF$_2$CF$_2$CF$_2$CF$_2$CF$_2$)$_{m28-1}$OCF$_2$CF$_2$ $CF_3CF_2CF_2CF_2CF_2CF_2$—$(OCF_2CF_2$—
  $OCF_2CF_2CF_2CF_2)_{m28-1}OCF_2CF_2$
$CF_3CF(CF_3)$—$(OCF_2CF_2$—$OCF_2CF_2CF_2CF_2$
  $CF_2CF_2)_{m28-1}OCF_2CF_2$
F-cycloC$_4$F$_6$—$(OCF_2CF_2$—$OCF_2CF_2CF_2CF_2$
  $CF_2CF_2)_{m28-1}OCF_2CF_2$
F-cycloC$_6$F$_{10}$—$(OCF_2CF_2$—$OCF_2CF_2CF_2CF_2$
  $CF_2CF_2)_{m28-1}OCF_2CF_2$
$CF_3$—$(OCF(CF_3)CF_2)_{m29}\{(OCF_2)_{m21}\cdot(OCF_2CF_2)_{m22-2}\}$
$CF_3CF_2$—$(OCF(CF_3)CF_2)_{m29}\{(OCF_2)_{m21}\cdot(OCF_2CF_2)_{m22-2}\}$
$CF_3CF_2CF_2$—$(OCF(CF_3)CF_2)_{m29}\{(OCF_2)_{m21}\cdot(OCF_2CF_2)_{m22-2}\}$
$CF_3CF_2CF_2CF_2$—$(OCF(CF_3)CF_2)_{m29}\{(OCF_2)_{m21}\cdot(OCF_2CF_2)_{m22-2}\}$
$CF_3CF_2CF_2CF_2CF_2$—$(OCF(CF_3)CF_2)_{m29}\{(OCF_2)_{m21}\cdot(OCF_2CF_2)_{m22-2}\}$,
$CF_3CF_2CF_2CF_2CF_2CF_2$—$(OCF(CF_3)CF_2)_{m29}\{(OCF_2)_{m21}\cdot(OCF_2CF_2)_{m22-2}\}$
$CF_3CF(CF_3)$—$(OCF(CF_3)CF_2)_{m29}\{(OCF_2)_{m21}\cdot(OCF_2CF_2)_{m22-2}\}$
F-cycloC$_4$F$_6$—$(OCF(CF_3)CF_2)_{m29}\{(OCF_2)_{m21}\cdot(OCF_2CF_2)_{m22-2}\}$
F-cycloC$_6$F$_{10}$—$(OCF(CF_3)CF_2)_{m29}\{(OCF_2)_{m21}\cdot(OCF_2CF_2)_{m22-2}\}$
$CF_3$—$(OCF(CF_3)CF_2)_{m29}$—$(OCF_2CF_2CF_2)_{m24}$
$CF_3CF_2$—$(OCF(CF_3)CF_2)_{m29}$—$(OCF_2CF_2CF_2)_{m24}$
$CF_3CF_2CF_2$—$(OCF(CF_3)CF_2)_{m29}$—$(OCF_2CF_2CF_2)_{m24}$
$CF_3CF_2CF_2CF_2$—$(OCF(CF_3)CF_2)_{m29}$—$(OCF_2CF_2CF_2)_{m24}$
$CF_3CF_2CF_2CF_2CF_2$—$(OCF(CF_3)CF_2)_{m29}$—$(OCF_2CF_2CF_2)_{m24}$
$CF_3CF_2CF_2CF_2CF_2CF_2$—$(OCF(CF_3)CF_2)_{m29}$—$(OCF_2CF_2CF_2)_{m24}$
$CF_3CF(CF_3)$—$(OCF(CF_3)CF_2)_{m29}$—$(OCF_2CF_2CF_2)_{m24}$
F-cycloC$_4$F$_6$—$(OCF(CF_3)CF_2)_{m29}$—$(OCF_2CF_2CF_2)_{m24}$
F-cycloC$_6$F$_{10}$—$(OCF(CF_3)CF_2)_{m29}$—$(OCF_2CF_2CF_2)_{m24}$
$CF_3$—$(OCF(CF_3)CF_2CF_2)_{m29}\{(OCF_2)_{m21}\cdot(OCF_2CF_2)_{m22-2}\}$
$CF_3CF_2$—$(OCF(CF_3)CF_2CF_2)_{m29}\{(OCF_2)_{m21}\cdot(OCF_2CF_2)_{m22-2}\}$
$CF_3CF_2CF_2$—$(OCF(CF_3)CF_2CF_2)_{m29}\{(OCF_2)_{m21}\cdot(OCF_2CF_2)_{m22-2}\}$
$CF_3CF_2CF_2CF_2$—$(OCF(CF_3)CF_2CF_2)_{m29}\{(OCF_2)_{m21}\cdot(OCF_2CF_2)_{m22-2}\}$
$CF_3CF_2CF_2CF_2CF_2$—$(OCF(CF_3)CF_2CF_2)_{m29}\{(OCF_2)_{m21}\cdot(OCF_2CF_2)_{m22-2}\}$
$CF_3CF_2CF_2CF_2CF_2CF_2$—$(OCF(CF_3)CF_2CF_2)_{m29}\{(OCF_2)_{m21}\cdot(OCF_2CF_2)_{m22-2}\}$
$CF_3CF(CF_3)$—$(OCF(CF_3)CF_2CF_2)_{m29}\{(OCF_2)_{m21}\cdot(OCF_2CF_2)_{m22-2}\}$
F-cycloC$_4$F$_6$—$(OCF(CF_3)CF_2CF_2)_{m29}\{(OCF_2)_{m21}\cdot(OCF_2CF_2)_{m22-2}\}$
F-cycloC$_6$F$_{10}$—$(OCF(CF_3)CF_2CF_2)_{m29}\{(OCF_2)_{m21}\cdot(OCF_2CF_2)_{m22-2}\}$
$CF_3$—$(OCF(CF_3)CF_2CF_2)_{m29}$—$(OCF_2CF_2CF_2)_{m24}$
$CF_3CF_2$—$(OCF(CF_3)CF_2CF_2)_{m29}$—$(OCF_2CF_2CF_2)_{m24}$
$CF_3CF_2CF_2$—$(OCF(CF_3)CF_2CF_2)_{m29}$—$(OCF_2CF_2CF_2)_{m24}$
$CF_3CF_2CF_2CF_2$—$(OCF(CF_3)CF_2CF_2)_{m29}$—$(OCF_2CF_2CF_2)_{m24}$
$CF_3CF_2CF_2CF_2CF_2$—$(OCF(CF_3)CF_2CF_2)_{m29}$—$(OCF_2CF_2CF_2)_{m24}$
$CF_3CF_2CF_2CF_2CF_2CF_2$—$(OCF(CF_3)CF_2CF_2)_{m29}$—$(OCF_2CF_2CF_2)_{m24}$
$CF_3CF(CF_3)$—$(OCF(CF_3)CF_2CF_2)_{m29}$—$(OCF_2CF_2CF_2)_{m24}$
F-cycloC$_4$F$_6$—$(OCF(CF_3)CF_2CF_2)_{m29}$—$(OCF_2CF_2CF_2)_{m24}$
F-cycloC$_6$F$_{10}$—$(OCF(CF_3)CF_2CF_2)_{m29}$—$(OCF_2CF_2CF_2)_{m24}$ As the compound (1-1) where $Y^{11}$ is the group (g2-1), for example, the compound of the following formula may be mentioned.

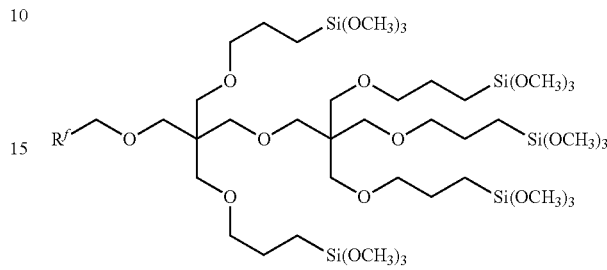

As the compound (1-1) where $Y^{11}$ is the group (g2-2), for example, the compounds of the following formulas may be mentioned.

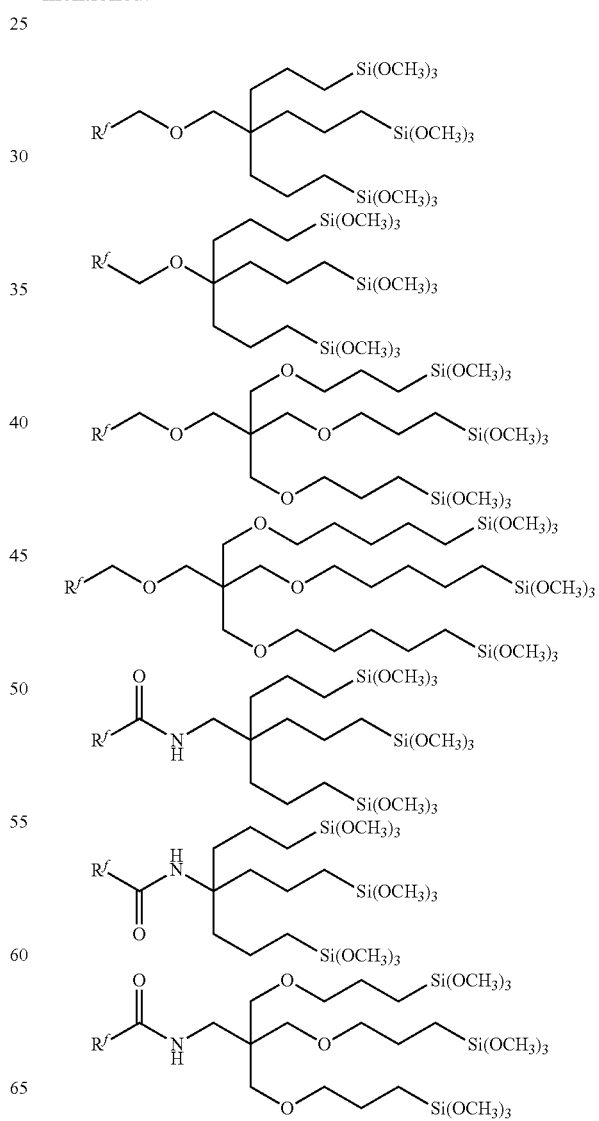

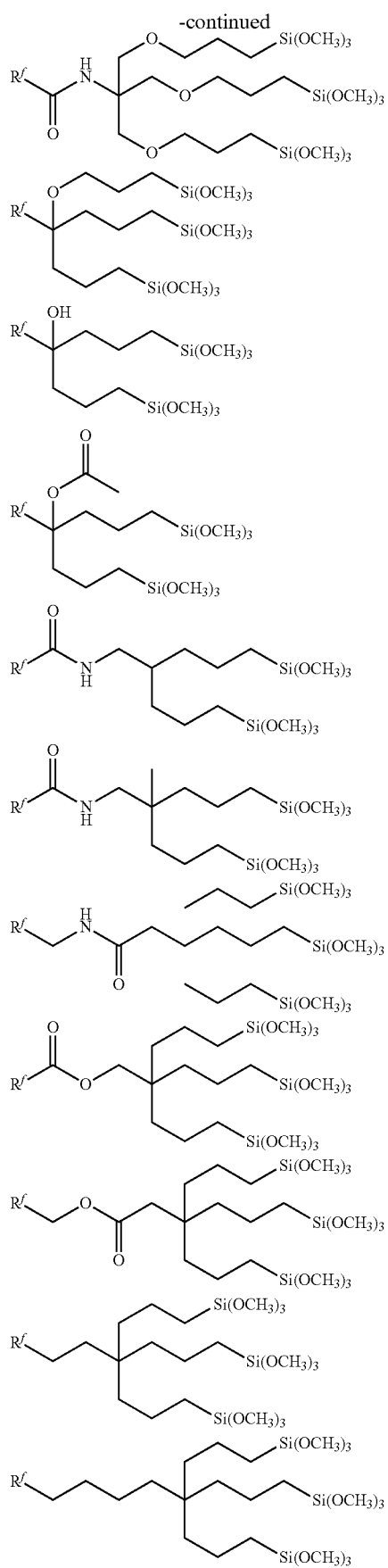
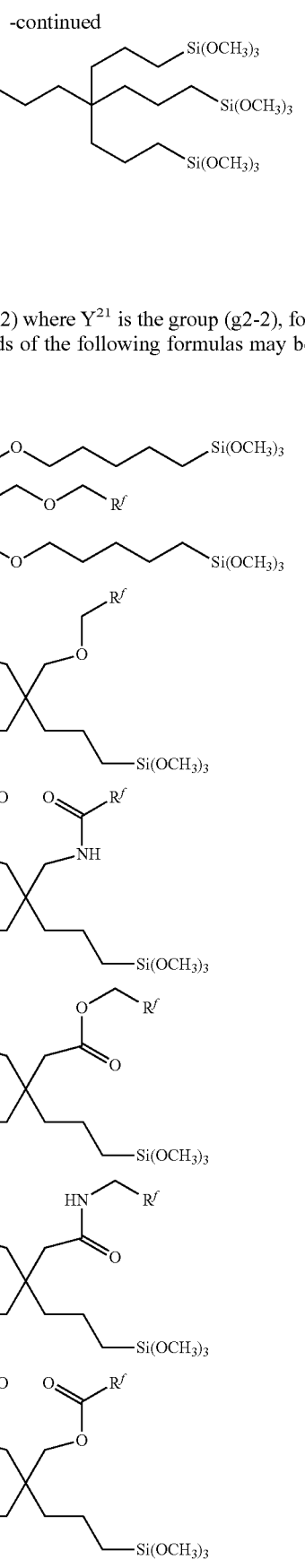
As the compound (1-2) where $Y^{21}$ is the group (g2-2), for example, the compounds of the following formulas may be mentioned.

-continued
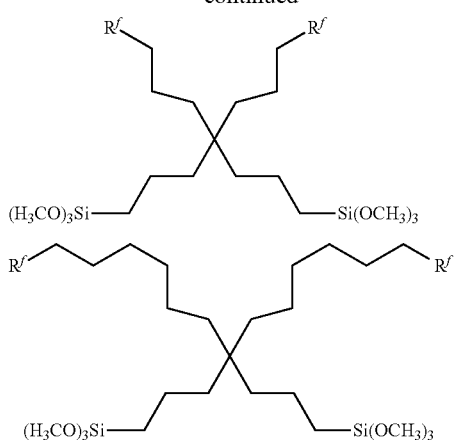
As the compound (1-1) where $Y^{11}$ is the group (g2-3), for example, the compounds of the following formulas may be mentioned.
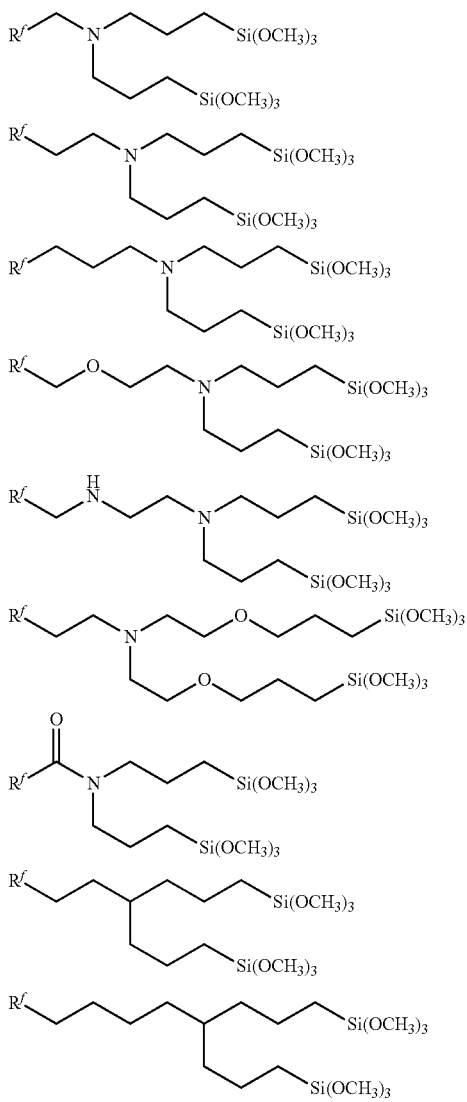
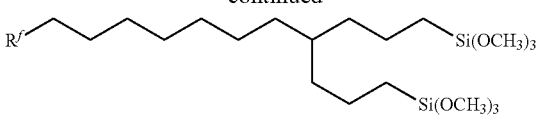
As the compound (1-1) where $Y^{11}$ is the group (g2-4), for example, the compounds of the following formulas may be mentioned.
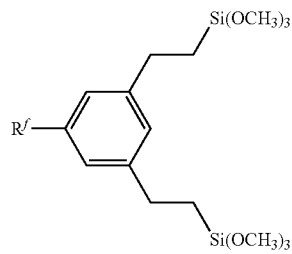
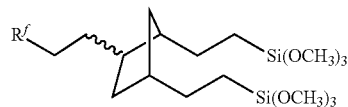
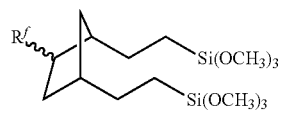
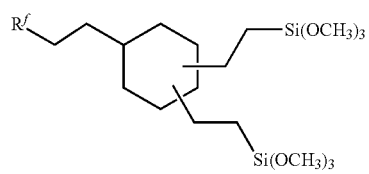
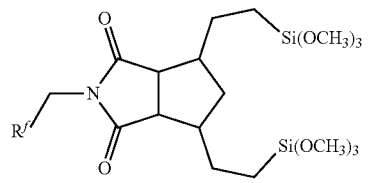
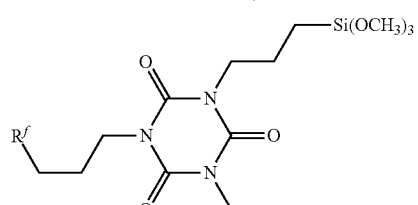
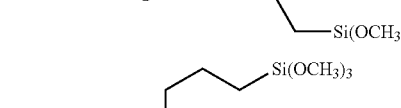
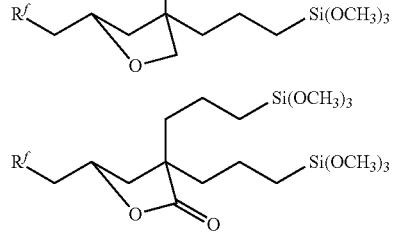

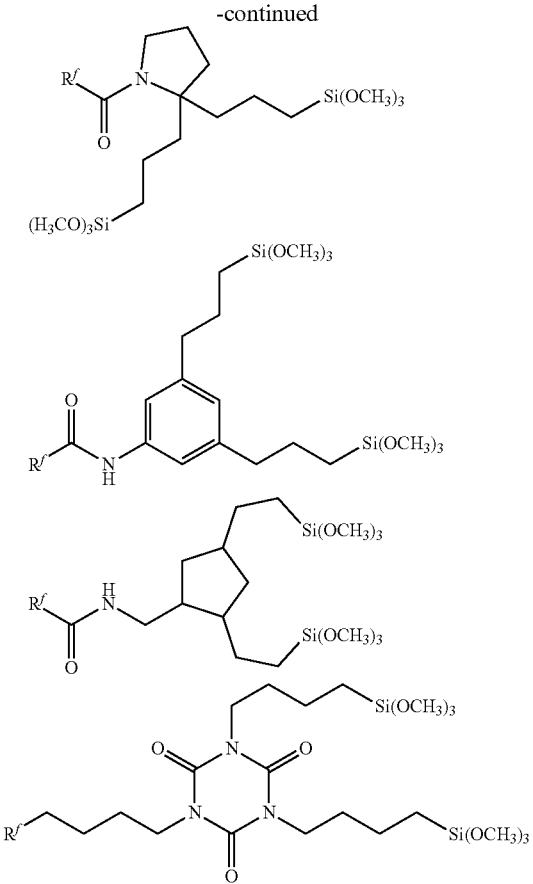

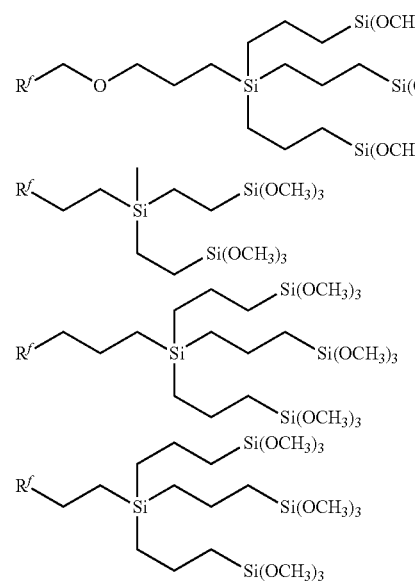

As the compound (1-1) where $Y^{11}$ is the group (g2-5), for example, the compounds of the following formulas may be mentioned.

As the compound (1-1) where $Y^{11}$ is the group (g2-7), for example, the compounds of the following formulas may be mentioned.

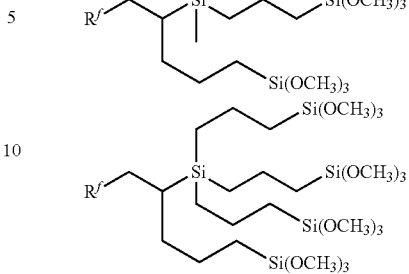

As the compound (1-1) where $Y^{11}$ is the group (g3-1), for example, the compounds of the following formulas may be mentioned.

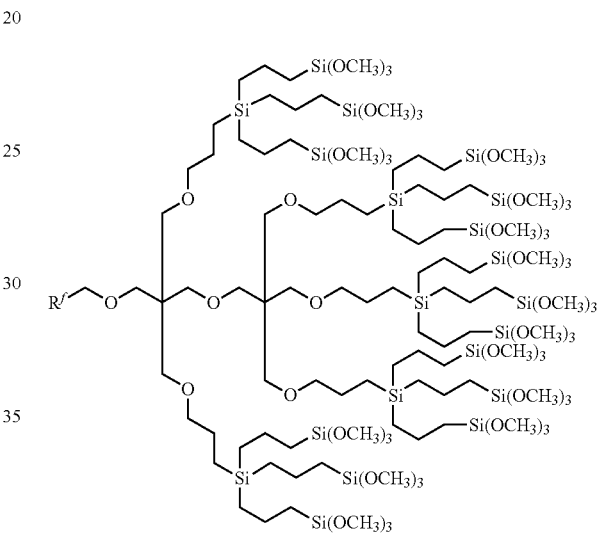

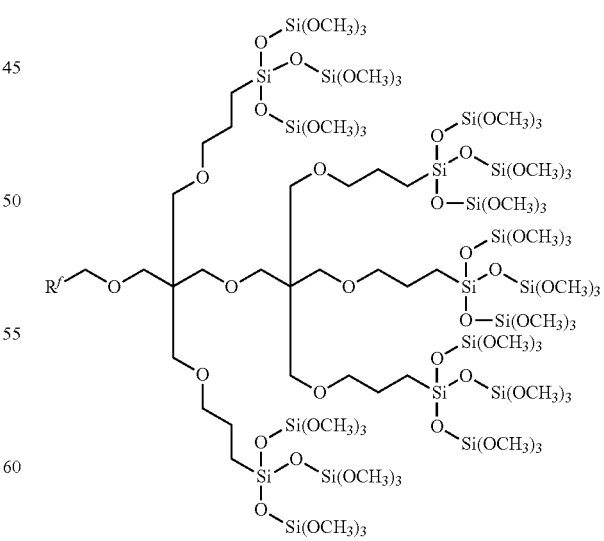

As the compound (1-1) where $Y^{11}$ is the group (g3-2), for example, the compounds of the following formulas may be mentioned.

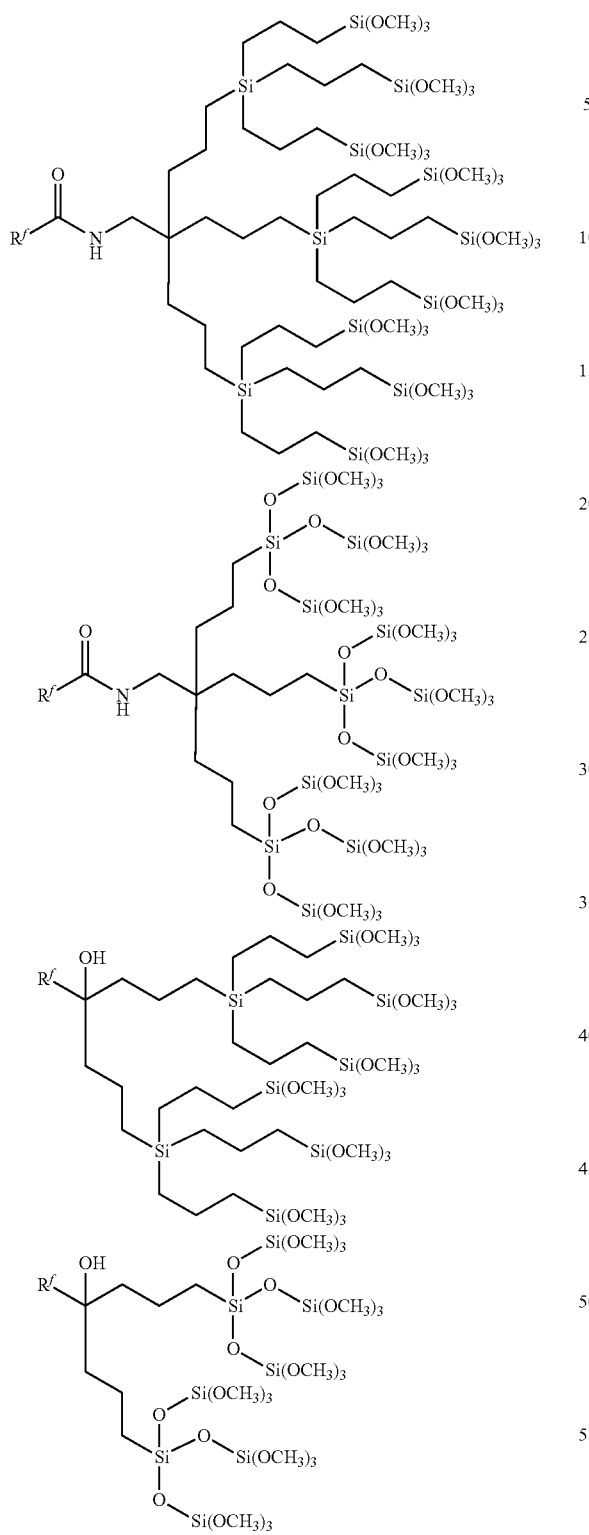
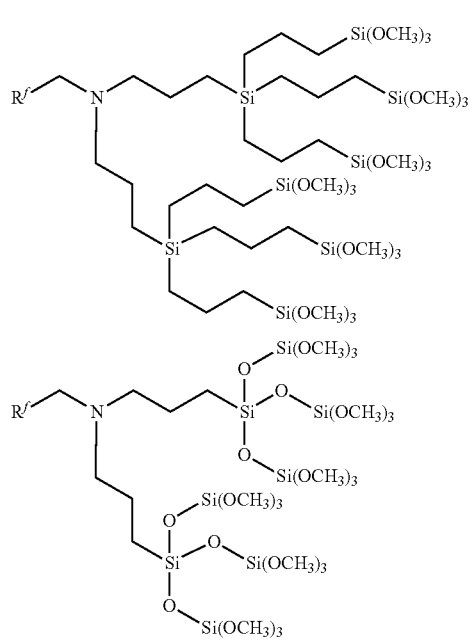
As the compound (1-1) where $Y^{11}$ is the group (g3-4), for example, the compounds of the following formulas may be mentioned.
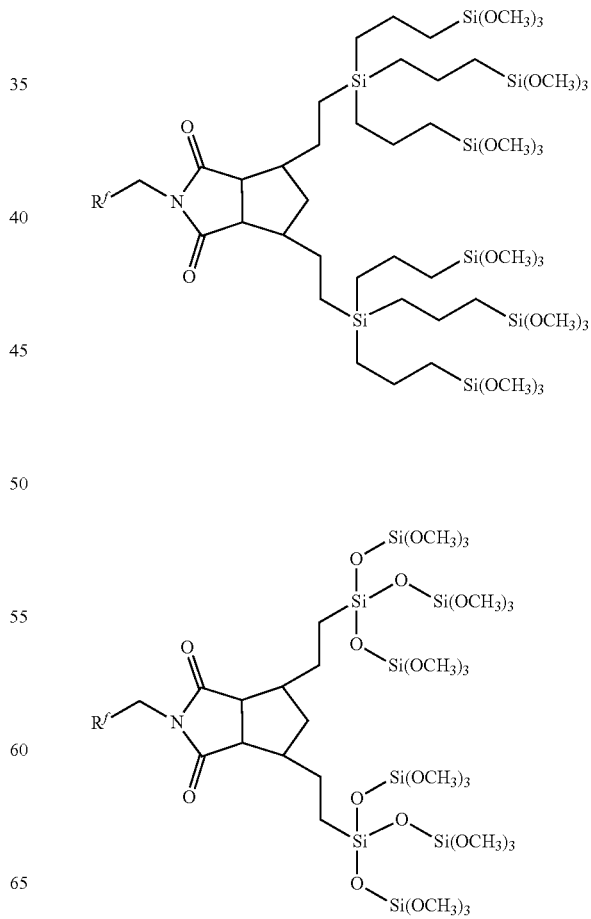
As the compound (1-1) where $Y^{11}$ is the group (g3-3), for example, the compounds of the following formulas may be mentioned.

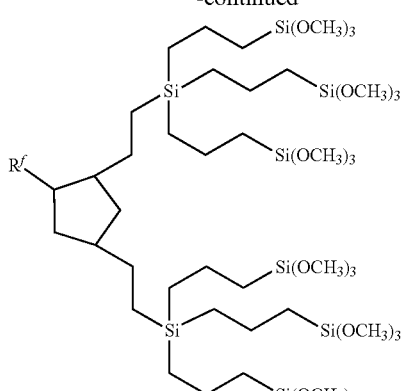
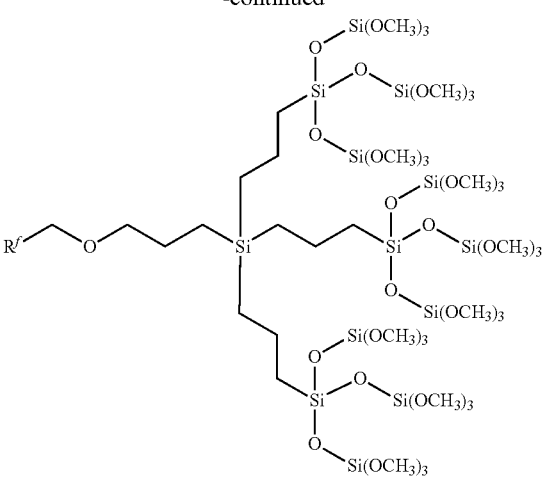
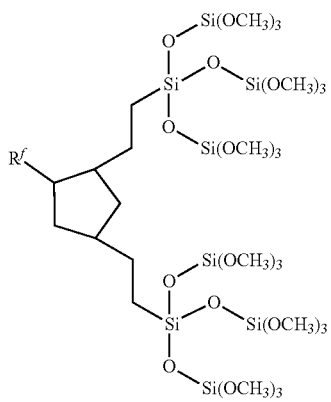
As the compound (1-1) where $Y^{11}$ is the group (g3-6), for example, the compounds of the following formulas may be mentioned.
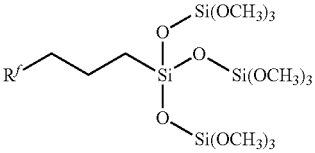
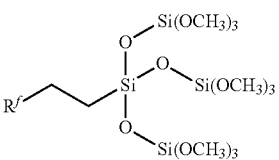
As the compound (1-1) where $Y^{11}$ is the group (g3-5), for example, the compounds of the following formulas may be mentioned.
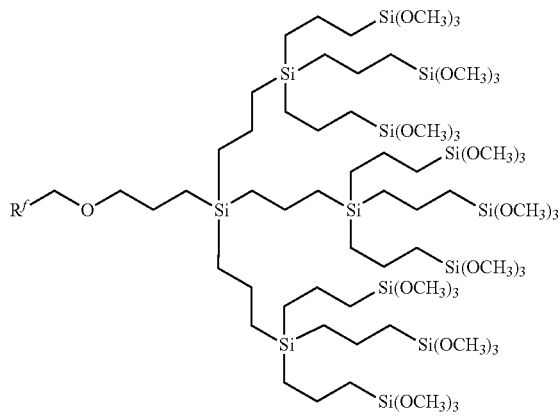
As the compound (1-1) where $Y^{11}$ is the group (g3-7), for example, the compounds of the following formulas may be mentioned.
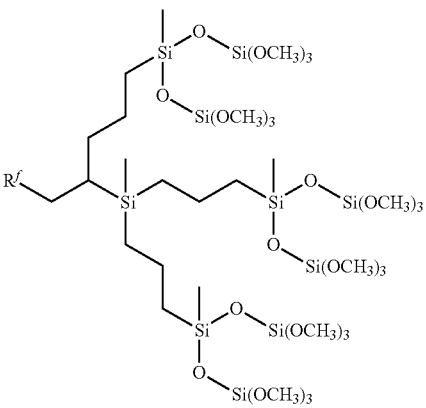

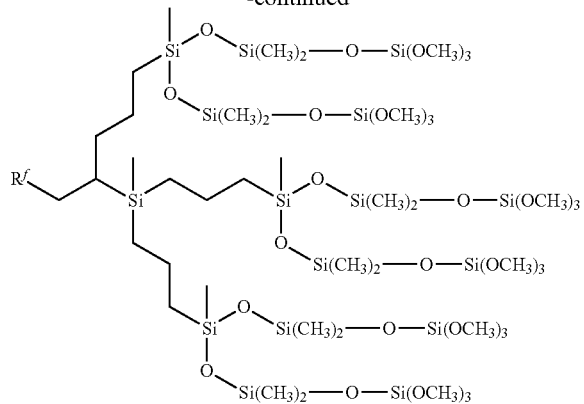
As the compound (1-2) where $Y^{21}$ is the group (g2-1), for example, the compounds of the following formulas may be mentioned.
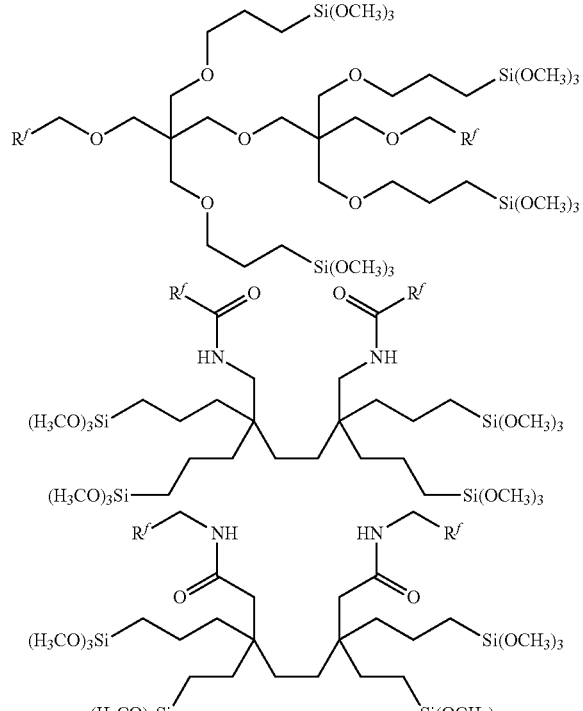
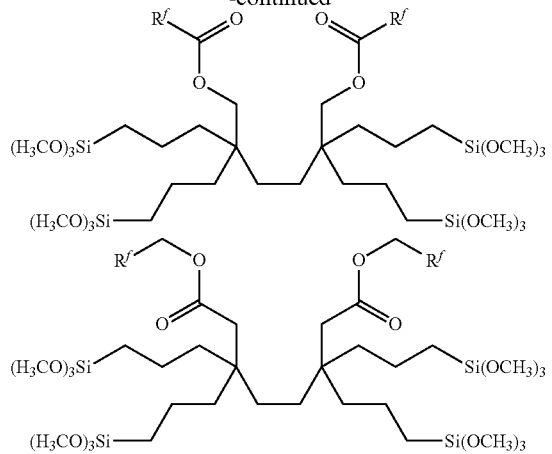
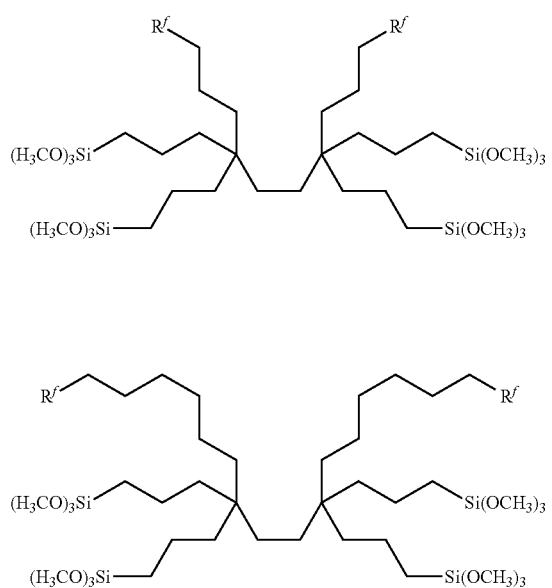
As the compound (1-3) where $Y^{31}$ and $Y^{32}$ are groups (g2-1), for example, the compounds of the following formulas may be mentioned.
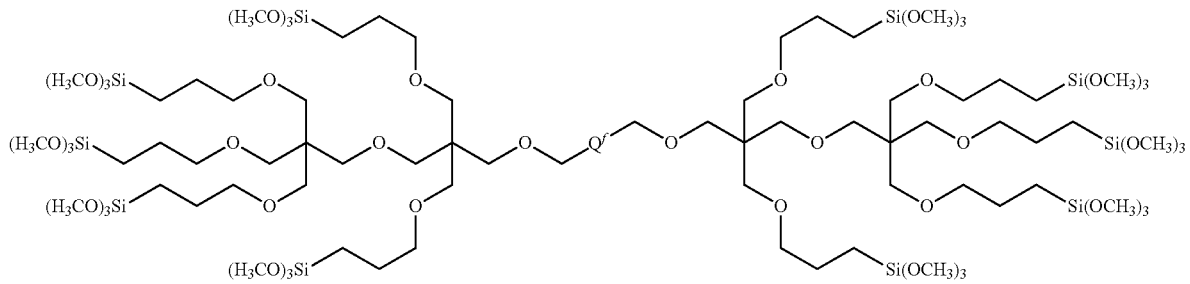

As the compound (1-3) where $Y^{31}$ and $Y^{32}$ are groups (g2-2), for example, the compounds of the following formulas may be mentioned.
As the compound (1-3) where $Y^{31}$ and $Y^{32}$ are groups (g2-3), for example, the compounds of the following formulas may be mentioned.
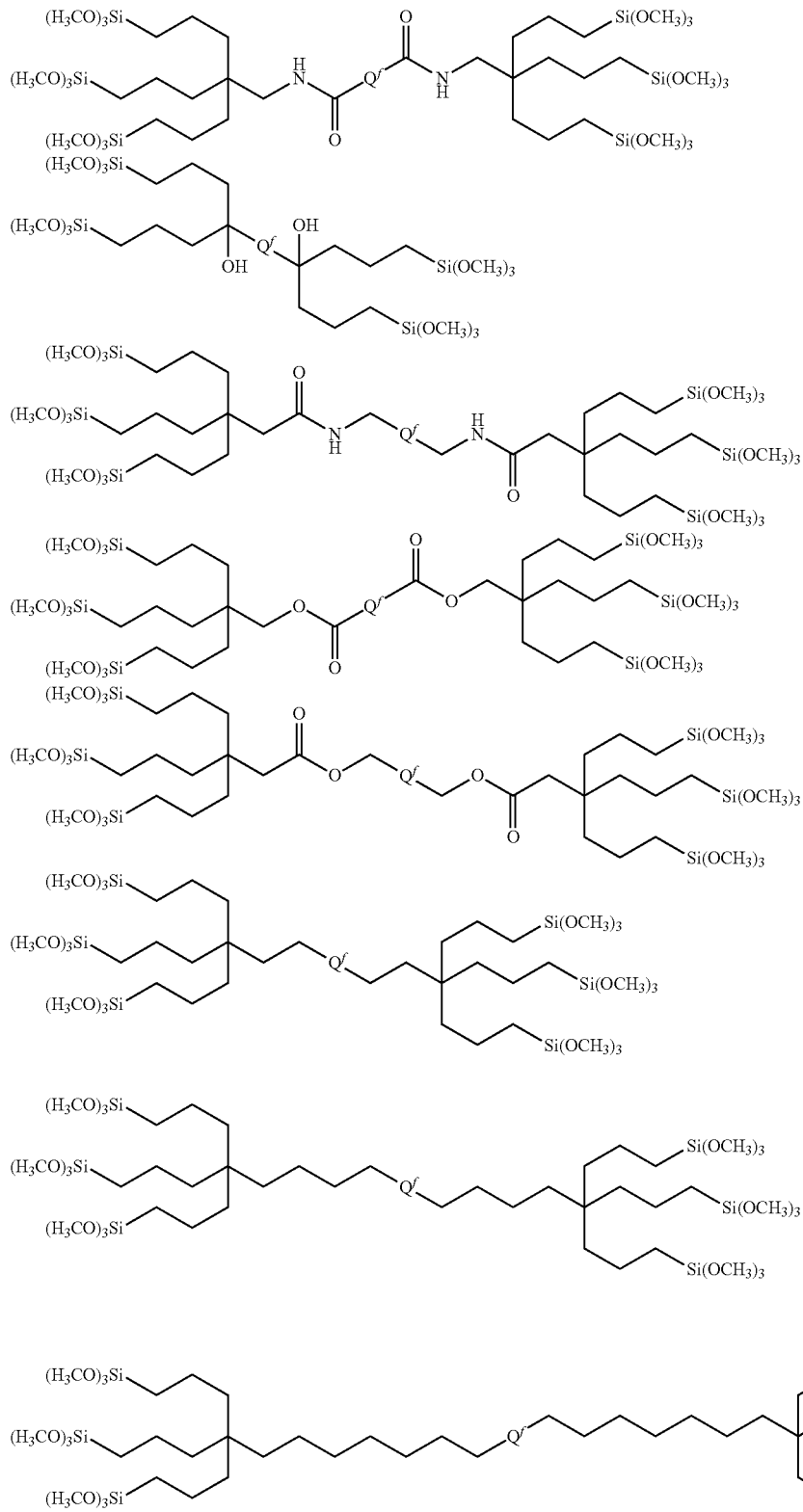

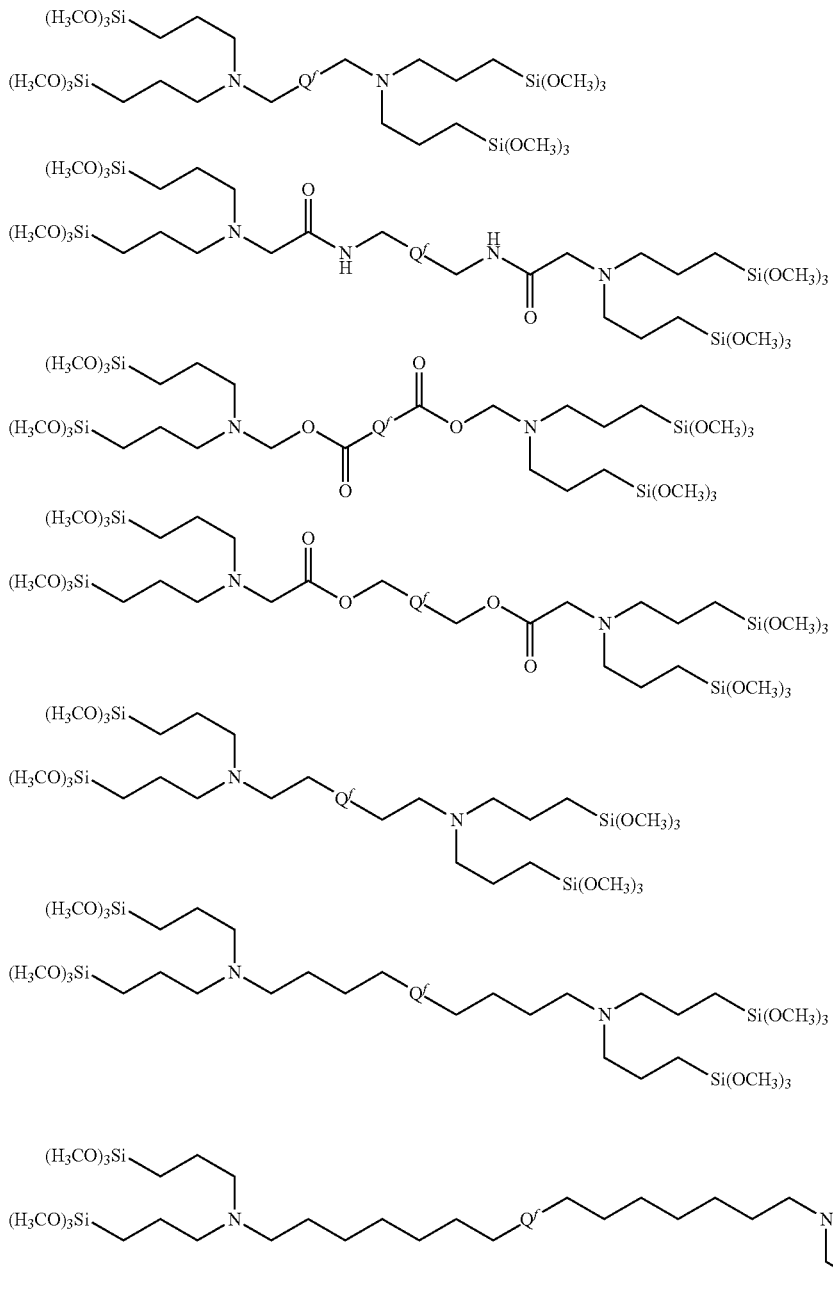
As the compound (1-3) where $Y^{31}$ and $Y^{32}$ are groups (g2-4), for example, the compound of the following formula may be mentioned.
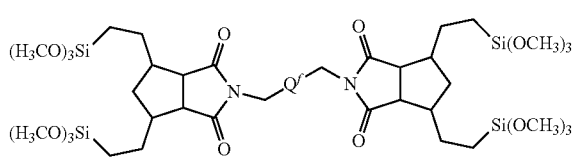
As the compound (1-3) where $Y^{31}$ and $Y^{32}$ are groups (g2-5), for example, the compound of the following formula may be mentioned.
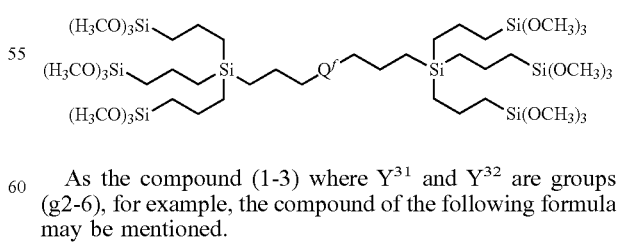
As the compound (1-3) where $Y^{31}$ and $Y^{32}$ are groups (g2-6), for example, the compound of the following formula may be mentioned.

As the compound (1-3) where $Y^{31}$ and $Y^{32}$ are groups (g2-7), for example, the compound of the following formula may be mentioned.

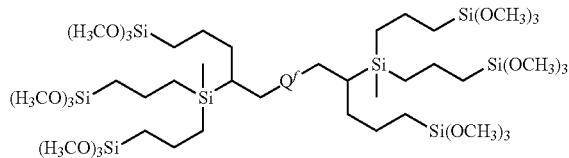

As the compound (1-3) where $Y^{31}$ and $Y^{32}$ are groups (g3-2), for example, the compounds of the following formulas may be mentioned.

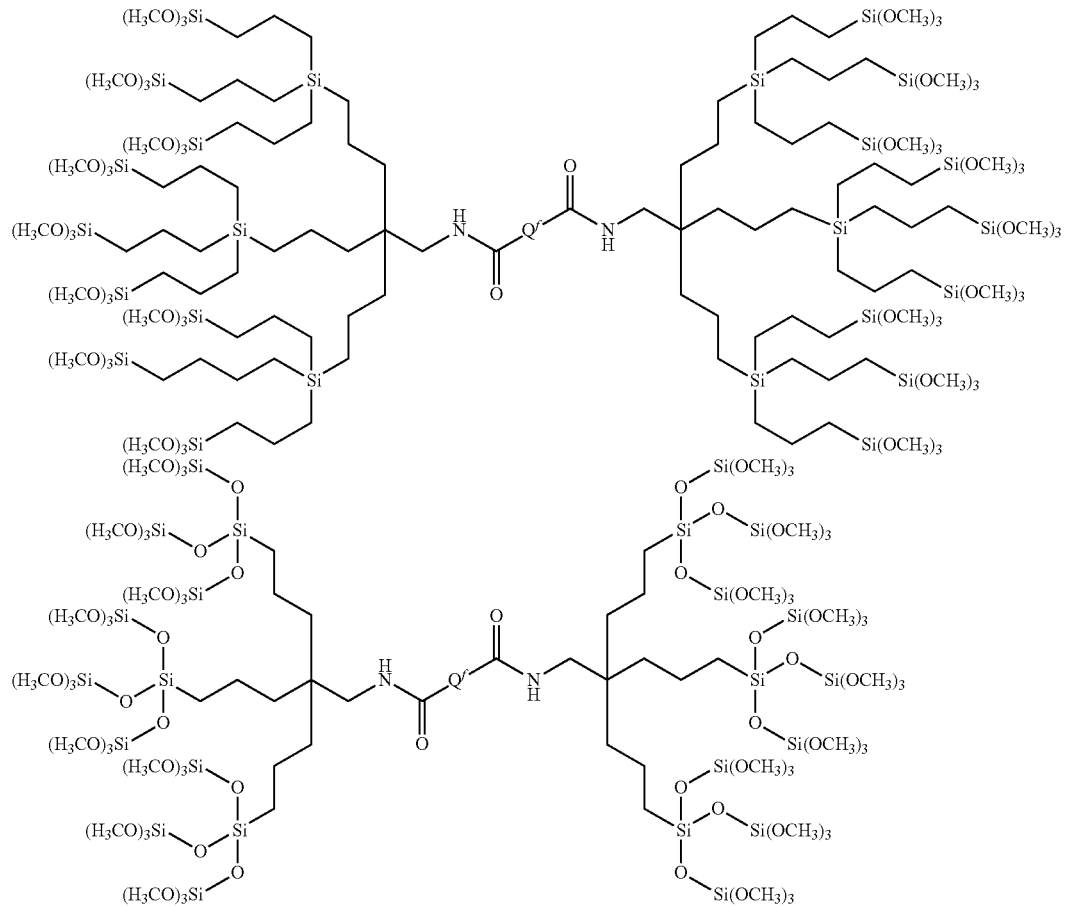

As specific examples of the compound (1), for example, those described in the following documents may be mentioned.

Perfluoropolyether-modified aminosilane, as described in JP-A-H11-029585,

Silicon-containing organic fluorinated polymers, as described in Japanese Patent No. 2874715, Organosilicon compounds as described in JP-A-2000-144097, Perfluoropolyether-modified aminosilane, as described in JP-A-2000-327772, Fluorinated siloxane, as described in JP-A-2002-506887, Organosilicone compounds as described in JP-A-2008-534696, Fluorinated modified hydrogen-containing polymers as described in Japanese Patent No. 4138936, The compounds described in U.S. Patent Application Publication No. 2010/0129672, WO2014/126064, JP-A-2014-070163, Organosilicon compounds as described in WO2011/060047, WO2011/059430, Fluorinated organosilane compounds described in WO2012/064649, Fluorooxyalkylene group-containing polymers as described JP-A-2012-72272, Fluorinated ether compounds as described in WO2013/042732, WO2013/121984, WO2013/121985, WO2013/121986, WO2014/163004, WO2014/080473, WO2015/087902, WO2017/038830, WO2017/038832, and WO2017/187775, Perfluoro(poly)ether-containing silane compounds as described in JP-A-2014-218639, WO2017/022437, WO2018/079743, WO2018/143433, Fluoropolyether group-containing polymer modified silane as described in JP-A-2015-199906, JP-A-2016-204656, JP-A-2016-210854, and JP-A-2016-222859

Fluorinated ether compounds as described in WO2018/216630, WO2019/039226, WO2019/039341, WO2019/039186, WO2019/044479, JP-A-2019-44158, WO2019/163282.

[Method for Producing an Article with a Water and Oil Repellent Layer]

One example of the method for producing an article with a water and oil repellent layer is a method for producing an article with a water and oil repellent layer which comprises (a) forming a silicon oxide layer containing alkali metal atoms on the surface of a substrate using a silicon oxide forming material containing a silicon oxide precursor and an alkali metal source, and then (b) forming a water and oil repellent layer comprising a hydrolytic condensation product of the above-mentioned compound (1) on the surface of the silicon oxide layer, wherein the silicon oxide layer is a silicon oxide layer having the above-mentioned alkali metal atom concentration.

Specific examples of the silicon oxide precursor include silicic acid, a partial condensation product of silicic acid, an alkali metal silicate, a silane compound with a hydrolyzable group bonded to a silicon atom, and a partial hydrolytic condensation product of such a silane compound.

Silicic acid or its partial condensation product can be dehydrated and condensed to form silicon oxide, and an alkali metal silicate can be made into silicic acid or its partial condensation product by an acid or cation exchange resin, and the formed silicic acid or its partial condensation product can be dehydrated and condensed to form silicon oxide.

Specific examples of the hydrolyzable group in a silane compound having a hydrolyzable group bonded to a silicon atom include an alkoxy group and a chlorine atom. The hydrolyzable group in the silane compound can be hydrolyzed to form a hydroxy group, and the silanol compound to be formed can be dehydrated and condensed to form silicon oxide.

Specific examples of the silane compound having a hydrolyzable group bonded to a silicon atom include an alkoxysilane such as a tetraalkoxysilane or an alkyltrialkoxysilane, and tetrachlorosilane.

As the silicon oxide precursor, silicic acid, a partial condensation product of silicic acid, a tetraalkoxysilane and its partial hydrolytic condensation product are preferred.

As the alkali metal source, an alkali metal hydroxide, a water-soluble alkali metal salt, etc. may be mentioned. As the water-soluble alkali metal salt, an alkali metal carbonate, an alkali metal bicarbonate, an alkali metal hydrochloride, an alkali metal nitrate, etc. may be mentioned. As the alkali metal source, an alkali metal hydroxide and an alkali metal carbonate are preferred.

Further, an alkali metal silicate can be used as a silicon oxide precursor and an alkali metal source. As described above, an alkali metal silicate can be converted to silicon oxide through silicic acid, but in this process, a small amount of the alkali metal may remain in the silicon oxide to be formed. Therefore, it is possible to intentionally adjust the amount of the residual alkali metal to obtain silicon oxide containing a predetermined amount of alkali metal atoms.

As the method for forming a silicon oxide layer containing alkali metal atoms, the following methods (a1) and (a2) are preferred. Method (a1) is a method using wet coating, and method (a2) is a method using dry coating.

(a1): A method of forming a silicon oxide layer on the surface of a substrate by using a coating solution containing at least one type of silicon oxide precursor selected from the group consisting of silicic acid, a partially condensed product of silicic acid, an alkoxysilane and its partially hydrolyzed condensed product, an alkali metal source, and a solvent.

(a2): A method of forming a silicon oxide layer on the surface of a substrate by using silicon oxide containing alkali metal atoms.

(a1)

As the coating solution for forming a silicon oxide layer, it is preferred to contain, as the silicon oxide precursor, at least one type selected from the group consisting of silicic acid and its partial condensation product, from such a viewpoint that it will be easy to form the silicon oxide layer, and it is particularly preferred to contain a partial condensation product of silicic acid.

As a raw material for the production of silicic acid or its partial condensation product, it is preferred to use an alkali metal silicate. By using an alkali metal silicate, it is possible to incorporate a predetermined concentration of alkali metal atoms in the silicon oxide layer to be formed. Further, it is also possible to adjust the concentration of alkali metal atoms in the silicon oxide layer to be formed, by using an alkali metal source such as an alkali metal hydroxide.

Specifically, preferred is a method for adjustment, which comprises obtaining an aqueous silicic acid solution by subjecting an aqueous alkali metal silicate solution to desalting treatment and then adding a water-soluble organic solvent to the aqueous silicic acid solution. By appropriately selecting the desalting treatment conditions, it is possible to incorporate a desirable amount of alkali metal atoms in the aqueous silicic acid solution. As the method of desalting treatment, for example, a method of mixing an alkali metal silicate aqueous solution and a cation exchange resin, followed by stirring, and then removing the cation exchange resin, may be mentioned. As the alkali metal silicate to be used in this method, sodium silicate is preferred.

As the alkali metal silicate, a silicate represented by $M_2O \cdot nSiO_2$ may be mentioned, and specifically, metasilicate ($M_2SiO_3$), orthosilicate ($M_4SiO_4$), disilicate ($M_2Si_2O_5$), tetrasilicate ($M_2Si_4O_5$), etc. may be mentioned.

As sodium silicate, $Na_2O \cdot nSiO_2$ as specified in JIS K1408-1966 may be mentioned, and, as its specific examples, sodium metasilicate ($Na_2SiO_3$), sodium orthosilicate ($Na_4SiO_4$), sodium disilicate ($Na_2Si_2O_5$) and sodium tetrasilicate ($Na_2Si_4O_9$) may be mentioned.

As the solvent, water and a water-soluble organic solvent are preferred. As specific examples of the water-soluble organic solvent, an alcohol-type organic solvent, a ketone-type organic solvent, an ether-type organic solvent and an ester-type organic solvent may be mentioned, and an alcohol-type organic solvent is preferred. As specific examples of the alcohol-type organic solvent, isopropyl alcohol, ethanol and n-butanol may be mentioned.

The solid content concentration ($SiO_2$ equivalent) of the coating solution is preferably from 0.001 to 10 mass %, particularly preferably from 0.1 to 3 mass %.

As specific examples of the method for wet coating a coating solution on the surface of a substrate, a spin coating method, a wipe coating method, a spray coating method, a squeegee coating method, a dip coating method, a die coating method, an inkjet method, a flow coating method, a roll coating method, a cast method, a Langmuir-Blodgett method and a gravure coating method may be mentioned.

By wet coating the coating solution on the surface of the substrate to form a wet film, then the solvent of the wet film is removed, and the silicic acid and its partial condensation product are condensed to form a silicon oxide layer.

The temperature for the removal of the solvent from the wet film and the temperature for the condensation of silicic acid and its partial condensation product, are preferably from 0 to 600° C., and from such a viewpoint that it will be possible to form a dense silicon oxide layer, from 200 to 600° C. is particularly preferred.

(a2)

As the method for dry coating by using silicon oxide containing alkali metal atoms, from the viewpoint of excellent simplicity of the process, a vacuum vapor deposition method, a CVD method or a sputtering method is preferred, and from the viewpoint of the simplicity of the equipment, a vacuum vapor deposition method is particularly preferred.

When two or more types of silicon oxide containing alkali metal atoms are to be vapor-deposited in the vacuum vapor deposition method, they may be co-deposited as one vapor deposition source or as separate vapor deposition sources. In particular, it is preferred to use one vapor deposition source consisting of silicon oxide containing alkali metal atoms. For example, when forming a silicon oxide layer containing two or more types of alkali metal atoms, it is preferred to use one vapor deposition source consisting of silicon oxide containing two or more types of alkali metal atoms.

As the silicon oxide containing alkali metal atoms to be used in the dry coating method, such as a vapor deposition source in a vacuum vapor deposition method, it is preferred to use silicon oxide containing alkali metal atoms, in which the content of alkali metal atoms is at least 200 ppm to Si. The content of alkali metal atoms is more preferably at least 1,000 ppm, particularly preferably at least 10,000 ppm, to Si. When the content of alkali metal atoms is at least the lower limit value, adhesion between the formed silicon oxide layer and the water and oil repellent layer will be excellent, and as a result, the water and oil repellent layer will be excellent in friction resistance. Further, the upper limit of the content of alkali metal atoms is preferably 200,000 ppm, particularly preferably 100,000 ppm, to Si.

As the method of producing silicon oxide containing alkali metal atoms, a method of adding silicon dioxide to an aqueous solution containing an alkali metal source, followed by stirring and removing water. As the silicon dioxide, porous silicon dioxide such as silica gel is preferred. As the alkali metal source-containing aqueous solution, an alkali metal hydroxide aqueous solution, an alkali metal carbonate aqueous solution, etc. may be mentioned. Further, it is also possible to produce an alkali metal atom-containing silicon oxide from the coating solution for forming the silicon oxide layer in the above (a1).

Further, it is also possible to use, as the alkali metal atom-containing silicon oxide, a porous silica gel containing alkali metal atoms produced from an alkali metal silicate such as sodium silicate, or a porous silica gel containing alkali metal atoms obtained by impregnating the porous silica gel with an aqueous solution containing an alkali metal source, followed by drying or calcination. As the silicon oxide containing alkali metal atoms, a commercially available product may be used, and a porous spherical silica gel produced from sodium silicate, such as M.S.GEL (trade name: manufactured by AGC Si-Tech Co., Ltd., may be mentioned.

Any form of silicon oxide containing alkali metal atoms may be used, and as specific examples, a powder, beads, pellets and cullets may be mentioned. Beads, pellets and cullets are preferred from such a viewpoint that it will be easier to use them as a vapor deposition source. Pellets may be made by any method, and, for example, a method of compacting the powder into pellets may be mentioned. The size of the pellets is not particularly limited, but, for example, a diameter of 1 cm or more is preferred, since small pellets fly off too much when coated, such being undesirable. As the method of producing cullets, a method of adding calcium for vitrification, followed by cutting by a cutter or grinding, may be mentioned.

(b)

After forming a silicon oxide layer containing alkali metal atoms, a water and oil repellent layer consisting of a hydrolytic condensation product of the compound (1) is formed on the exposed surface. As the method, a dry coating method or a wet coating method may be mentioned. Here, the exposed surface of the silicon oxide layer in the substrate with the silicon oxide layer, refers to the surface of the silicon oxide layer on which the water and oil repellent layer is to be formed.

(Dry Coating)

As specific examples of the dry coating method, a vacuum vapor deposition method, a CVD method and a sputtering method may be mentioned, and a vacuum vapor deposition method is preferred, from the viewpoint of suppressing decomposition of the compound (1) and from the viewpoint of simplicity of the equipment.

The temperature at the time of the vacuum vapor deposition is preferably from 20 to 300° C., particularly preferably from 30 to 200° C.

The pressure at the time of the vacuum vapor deposition is preferably at most $1\times10^{-1}$ Pa, particularly preferably at most $1\times10^{-2}$ Pa.

In dry coating, one type of the compound (1) may be used alone, or a mixture of two or more types of the compound (1) may be used, or a composition containing the compound (1) and another component (but, excluding a solvent) may also be used.

(Wet Coating)

As specific examples of the wet coating method, a spin coating method, a wipe coating method, a spray coating method, a squeegee coating method, a dip coating method, a die coating method, an inkjet method, a flow coating method, a roll coating method, a casting method, a Langmuir-Blodgett method and a gravure coating method may be mentioned.

In wet coating, a coating solution for forming a water and oil repellent layer is used.

The coating solution for forming a water and oil repellent layer is a solution or dispersion containing the compound (1) and a solvent.

As the solvent, an organic solvent is preferred. The organic solvent may be a fluorinated organic solvent or a non-fluorinated organic solvent, or may contain both solvents.

As the fluorinated organic solvent, a fluorinated alkane, a fluorinated aromatic compound, a fluoroalkyl ether, a fluorinated alkylamine, a fluoroalcohol, etc. may be mentioned.

As the non-fluorinated organic solvent, a compound consisting only of hydrogen atoms and carbon atoms, or a compound consisting only of hydrogen atoms, carbon atoms and oxygen atoms, is preferred, and a hydrocarbon organic solvent, an alcohol-type organic solvent, a ketone-type organic solvent, an ether-type organic solvent and an ester-type organic solvent, may be mentioned.

The coating solution for forming a water and oil repellent layer may contain, in addition to the compound (1) and a solvent, other components and impurities (such as byproducts formed in the production process of the compound (1)) to such an extent that the effects of the invention are not impaired.

As other components, for example, known additives such as acid catalysts and basic catalysts that promote hydrolysis and condensation reactions of hydrolyzable silyl groups, may be mentioned.

The solid content concentration in the coating solution for forming a water and oil repellent layer is preferably from 0.001 to 10 mass %, particularly preferably from 0.01 to 1 mass %. The solid content concentration in the coating solution for forming a water and oil repellent layer is a value to be calculated from the mass of the coating solution for forming the water and oil repellent layer before heating and the mass after heating in a convection dryer at 120° C. for 4 hours.

(Post Treatment)

In (b), in order to improve the friction resistance of the water and oil repellent layer, operations to promote the reaction between the compound (1) and the silicon oxide layer may be carried out as the case requires. As such operations, heating, humidification, light irradiation, etc. may be mentioned. For example, by heating the substrate with a silicon oxide layer, having a water and oil repellent layer formed, in an atmosphere having moisture, it is possible to promote the reactions, such as the hydrolysis reaction of hydrolyzable silyl groups to silanol groups, the formation of siloxane bonds by a condensation reaction of silanol groups, and the condensation reaction of silanol groups and OM groups at the surface of the silicon oxide layer and silanol groups of a fluorinated compound.

After the surface treatment, compounds in the water and oil repellent layer, that are not chemically bonded to other compounds or the silicon oxide layer, may be removed as the case requires. As a specific method, for example, a method of pouring a solvent on the water and oil repellent layer, or a method of wiping them off with a cloth soaked with a solvent, may be mentioned.

EXAMPLES

In the following, the present invention will be described in detail with reference to Examples. Ex. 1-1 to Ex. 1-12, Ex. 1-14 to Ex. 1-25 and Ex. 2-1 to Ex. 2-9 are Examples of the present invention, and Ex. 1-13 and Ex. 2-10 are Comparative Examples. However, the present invention is not limited to these Examples.

[Physical Properties and Evaluation]

(Average Molecular Weight)

The average molecular weight of a fluorinated compound was calculated by determining the number (average value) of oxyperfluoroalkylene groups based on the terminal group by $^1$H-NMR and $^{19}$F-NMR. The terminal group is, for example, A or $Si(R)_nX_{3-n}$ in the formula (1).

(Thickness of the Silicon Oxide Layer)

The thickness of the silicon oxide layer was measured by a spectroscopic ellipsometer (FE-3000 manufactured by Otsuka Electronics Co., Ltd.).

(TOF-SIMS)

In the silicon oxide layer, the average value of sodium concentration in the region of from 0.1 to 0.3 nm in depth from the surface in contact with the water and oil repellent layer was obtained in accordance with the following procedure by using a time-of-flight secondary ion mass spectrometry (TOF-SIMS) apparatus.

(I) First, a standard sample for sodium concentration determination was prepared. A quartz glass substrate with the same composition as the silicon oxide layer to be evaluated was prepared, and sodium was ion implanted into this substrate and used as the standard sample. For the ion implantation, a medium-current ion implanter (IMX-3500 RS manufactured by ULVAC, Inc.) was used, and the energy was set to be 110 keV and the sodium implantation volume was set to be $6.0 \times 10^{14}$ ions/cm$^2$.

(II) Next, the substrate with the silicon oxide layer to be evaluated and the standard sample prepared in (I) were simultaneously transported into the TOF-SIMS apparatus, and TOF-SIMS depth profile analysis by ion sputtering was conducted in turn, to obtain a profile of the sputtering time (horizontal axis) and the intensity (vertical axis) of $^{23}$Na$^+$ and $^{28}$Si$^+$.

Then, the sputtering time on the horizontal axis of the obtained profile was converted to a depth by using the depth of the standard sample. Here, the depth of the standard sample was measured by using a tactile surface profiler (Dektak150 manufactured by ULVAC, Inc.).

Then, the intensity of the vertical axis of the obtained profile was converted to sodium concentration by using the sputtering rate (0.0282 nm/sec) of the sputter ion determined from the standard sample and the RSF ($2.8182 \times 10^{20}$, also called Relative Sensitivity Factor) calculated from the depth direction profile of the standard sample, to obtain the depth direction profile of sodium concentration in the silicon oxide layer.

The TOF-SIMS analysis conditions used this time were as follows.

TOF-SIMS apparatus: Manufactured by ION-TOF GmbH, TOF.SIMS 5.
Primary ionic species: $Bi_1^+$
Primary ion acceleration voltage: 25 keV,
Primary ion current value: 1 pA (at 10 (at 10 kHz),
Primary ion raster size: 100×100 μm$^2$,
Primary ion bunching: Yes,
Cycle time: 100 μs,
Number of pixels: 128×128 pixels,
Sputtering ion species: $C_{60}^{++}$,
Accelerating voltage for sputtering: 10 keV,
Current value for sputtering: 1 nA (at 10 kHz),
Sputtering ion raster size: 400×400 μm$^2$,
Sputtering time per time: 1.634 seconds,
Vacuum: $5.0 \times 10^{-6}$ mbar (oxygen flow into the measurement chamber was conducted),
Na secondary ion mass number: 23,
Si secondary ion mass number: 28,
Neutralizing gun: Yes.

(III) Finally, from the depth direction profile of the sodium concentration in the silicon oxide layer obtained in (II), the average value of sodium concentration in the silicon oxide layer in the region of from 0.1 nm to 0.3 nm in depth from the surface in contact with the water and oil repellent layer was calculated. Here, in the depth direction profile of sodium concentration, the number of points plotted in the region of from 0.1 nm to 0.3 nm was four points. The average value of the sodium concentration was obtained as the average of these four points. When the measurement is conducted under the conditions described above, there can be four plots in the region of from 0.1 nm to 0.3 nm in depth from the surface in contact with the water and oil repellent layer.

Prior to the TOF-SIMS depth profile analysis by ion sputtering, it is desirable that the silicon oxide layer is exposed. That is, in a case where the water and oil repellent layer is present on the surface of the silicon oxide layer, or in a case where surface contamination has clearly progressed, it is desirable to remove them. As the removal method, oxygen plasma ashing treatment and ultraviolet (UV) ozone treatment may be mentioned. These should both be carried out depending on the thickness of the water and oil repellent layer and the degree of surface contamination.

In the present Examples, UV ozone treatment was conducted after the oxygen plasma ashing treatment. In the oxygen plasma ashing treatment, a low-temperature ashing system (Model LTA-102 manufactured by Yanaco Analytical Systems Inc.) was used. The treatment conditions were as follows: high frequency output: 50 W, oxygen flow rate: 50 mL/min, treatment time: 60 min. In the UV ozone treatment, a UV irradiation apparatus (PL30-200 manufactured by SEN Engineering) was used, and as the power source of the UV irradiation apparatus, UB2001D-20 was used. The treatment conditions were UV wavelength: 254 nm, treatment time: 10 minutes.

The present Examples are not necessary because TOF-SIMS depth profile analysis was conducted by ion sputtering on a substrate with a silicon oxide layer. However, if TOF-SIMS depth profile analysis by ion sputtering is performed on an article with a water and oil repellent layer, it is preferred to monitor the fluorine peak using X-ray photoelectron spectroscopy to confirm that it has been removed.

Further, the concentrations of alkali metals other than sodium were also measured in the same manner as the sodium concentration as described above.

(Water Contact Angle)

The contact angle of about 2 μL of distilled water placed on the surface of the water and oil repellent layer was measured at 20° C. by using a contact angle measurement device (DM-701 manufactured by Kyowa Interface Science Co., Ltd.). The measurement was conducted at five different locations on the surface of the water and oil repellent layer, and the average value was calculated and used as the initial contact angle. For the calculation of the contact angle, the 2θ method was used. Judgment standards are shown below.

- ⊚ (Excellent): The initial contact angle is at least 115 degrees.
- ○ (Good): The initial contact angle is at least 105 degrees and less than 115 degrees.
- Δ (Acceptable): The initial contact angle is at least 100 degrees and less than 105 degrees.
- x (Unacceptable): The initial contact angle is less than 100 degrees.

(Friction Resistance (Felt Wear))

With respect to the water and oil repellent layer, using a felt abrasion tester, the felt (dimensions: 10 mm×10 mm×50 mm) was moved back and forth at a load of 9.8 N and a speed of 80 rpm. The maximum number of reciprocations at which the water contact angle of the water and oil repellent layer can be maintained at 100 degrees or more and the maximum number of reciprocations at which the water contact angle can be maintained at 80 degrees or more are measured, respectively, and the friction resistance was judged in accordance with the following standards.

<The Number of Reciprocations of the Felt at which the Water Contact Angle of 100 Degrees can be Maintained>

- ⊚ (Excellent): The number of reciprocations is at least 15,000 times.
- ○ (Good): The number of reciprocations is at least 10,000 and less than 15,000 times.
- Δ (Acceptable): The number of reciprocations is at least 5,000 and less than 10,000 times.
- x (Unacceptable): The number of reciprocations is less than 5,000 times.

<The Number of Reciprocations of the Felt at which the Water Contact Angle of 80 Degrees can be Maintained>

- ⊚ (Excellent): The number of reciprocations is at least 25,000 times.
- ○ (Good): The number of reciprocations is at least 15,000 and less than 25,000 times.
- Δ (Acceptable): The number of reciprocations is at least 8,000 and less than 15,000 times.
- x (Unacceptable): The number of reciprocations is less than 8,000 times.

Synthesis Example 1

Compound (1-1A) was obtained in accordance with the method described in Ex. 3 of WO2017/038832.

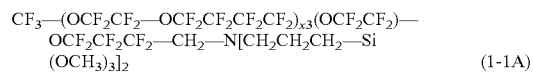

$CF_3-(OCF_2CF_2-OCF_2CF_2CF_2CF_2)_{x3}(OCF_2CF_2)-OCF_2CF_2CF_2-CH_2-N[CH_2CH_2CH_2-Si(OCH_3)_3]_2$ (1-1A)

Average value of the number of units x3: 13, Mn of Compound (1-1A): 5,020, Mn of the portion corresponding to $(OX)_m$ in the formula (1) in Compound (1-1A): 4,600

Synthesis Example 2

Compound (1-1B) was obtained in accordance with the method described in Ex. 11 of WO2017/038830.

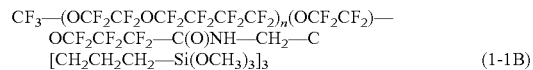

$CF_3-(OCF_2CF_2OCF_2CF_2CF_2CF_2)_n(OCF_2CF_2)-OCF_2CF_2CF_2-C(O)NH-CH_2-C[CH_2CH_2CH_2-Si(OCH_3)_3]_3$ (1-1B)

Average value of the number of units n: 13, Mn of Compound (1-1B): 5,400, Mn of the portion corresponding to $(OX)_m$ in the formula (1) in Compound (1-1B): 4,600

Synthesis Example 3

Compound (1-1C) was obtained in accordance with the method described in Synthesis Example 15 of Japanese Patent No. 5761305.

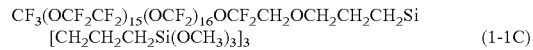

$CF_3(OCF_2CF_2)_{15}(OCF_2)_{16}OCF_2CH_2OCH_2CH_2CH_2Si[CH_2CH_2CH_2Si(OCH_3)_3]_3$ (1-1C)

Mn in Compound (1-1C): 3,600, Mn of the portion corresponding to $(OX)_m$ in the formula (1) in Compound (1-1C): 2,900

Synthesis Example 4

Compound (1-2A) was obtained in accordance with Ex. 16 of WO2017/187775. Here, the group represented by "PFPE" in the formula (1-2A) is $CF_3(OCF_2CF_2OCF_2CF_2CF_2CF_2)_{x3}OCF_2CF_2OCF_2CF_2CF_2-$. In the formula, the average value of the number of units x3 is 13.

Mn of Compound (1-2A): 10,100, Mn of the portion corresponding to $(OX)_m$ in the formula (1) in Compound (1-2A): 9,200

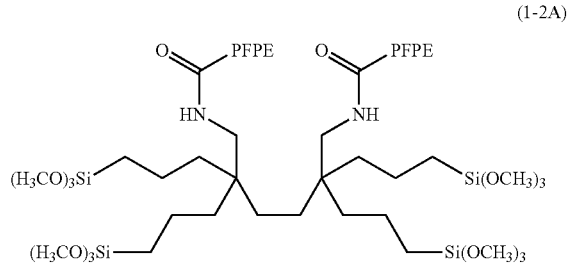

(1-2A)

Synthesis Example 5

Compound (1-2B) was synthesized by the following procedure.

In a nitrogen-substituted reactor, 21.8 g of NaH, weighed in a nitrogen-substituted box, was put into 100 g of dehydrated THF (tetrahydrofuran), followed by stirring in an ice bath, and 40 g of a 50 mass % malononitrile solution having malononitrile dissolved in dehydrated THF, was added, and then 80.6 g of allyl bromide was added, followed by stirring in an ice bath for 4 hours. After stopping the reaction by adding dilute hydrochloric acid solution, the reaction solution was washed with water and saturated brine, and the organic phase was collected. The recovered solution was concentrated in an evaporator to obtain the crude product. The crude product was subjected to silica gel column chromatography to fractionate 42 g of Compound (X5-1).

In a nitrogen-substituted 300 mL volumetric eggplant flask, 31.1 g of LiAlH$_4$ and 100 g of dehydrated THF were added, and the mixture was stirred in an ice bath until it reached 0° C. 40 g of Compound (X5-1) was slowly added dropwise. After confirming the disappearance of Compound (X5-1) by thin layer chromatography, Na$_2$SO$_4$·10H$_2$O was slowly added to the reaction crude solution and quenched it, followed by filtering through Celite and washing with water and saturated brine. The recovered organic layer was distilled off under reduced pressure and purified by column chromatography to obtain 32.5 of Compound (X5-2).

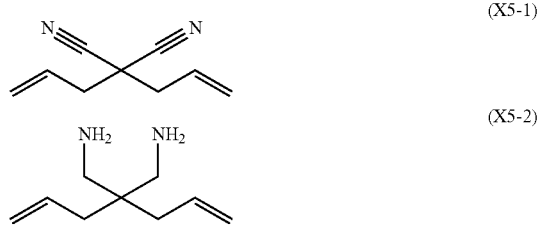

In a 50 mL eggplant flask, 0.4 g of Compound (X5-2) and 27 g of CF$_3$(OCF$_2$CF$_2$OCF$_2$CF$_2$CF$_2$CF$_2$)$_{13}$OCF$_2$CF$_2$OCF$_2$CF$_2$CF$_2$—C(O)—CH$_3$ were added, followed by stirring for 12 hours. From NMR, it was confirmed that Compound (X5-2) had been all converted to Compound (X5-3). Further, methanol as a byproduct, was formed. The obtained solution was diluted with 9.0 g of AE-3000 and purified by silica gel column chromatography to obtain 16.3 g of Compound (X5-3).

Here, in the following formula, PFPE is CF$_3$(OCF$_2$CF$_2$OCF$_2$CF$_2$CF$_2$CF$_2$)$_{13}$OCF$_2$CF$_2$OCF$_2$CF$_2$CF$_2$—.

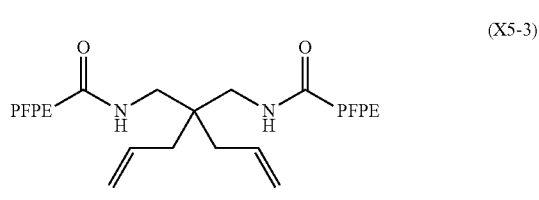

In a 100 mL PFA eggplant flask, 5.0 g of Compound (X5-3), 0.5 g of a xylene solution of platinum/1,3-divinyl-1,1,3,3-tetramethyldisiloxane complex (platinum content: 2%), 0.3 g of HSi(OCH$_3$)$_3$, 0.02 g of dimethyl sulfoxide, and 5.0 g of 1,3-bis(trifluoromethyl)benzene (manufactured by Tokyo Chemical Industry Co., Ltd.) were put, followed by stirring at 40° C. for 10 hours. After completion of the reaction, the solvent, etc. were distilled off under reduced pressure, followed by filtration through a membrane filter with a pore size of 0.2 μm to obtain Compound (1-2B) having two allyl groups in Compound (X5-3) hydrosilylated. The conversion rate of hydrosilylation was 100%, and no Compound (X5-3) remained.

Further, in the following formula, PFPE is CF$_3$(OCF$_2$CF$_2$OCF$_2$CF$_2$CF$_2$CF$_2$)$_{13}$OCF$_2$CF$_2$OCF$_2$CF$_2$CF$_2$—.

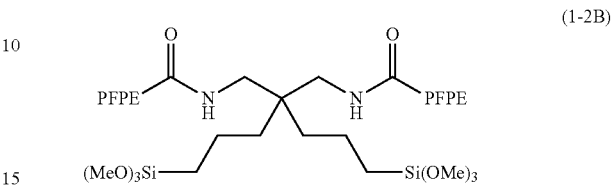

Mn of Compound (1-2B): 9,800, Mn of the portion corresponding to (OX)$_m$ in the formula (1) in Compound (1-2B): 9,200

Synthesis Example 6

A mixture (M1) containing the following Compound (1-3A) and the following Compound (1-1D) was synthesized by the following procedure.

Synthesis Example 6-1

Compound (X6-1) was obtained in accordance with the method described in Ex. 1-1 of Examples in WO 2013-121984.

CF$_2$=CFO—CF$_2$CF$_2$CF$_2$CH$_2$OH  (X6-1)

Synthesis Example 6-2

In a 200 mL eggplant flask, 16.2 g of HO—CH$_2$CF$_2$CF$_2$CH$_2$—OH and 13.8 g of potassium carbonate were put, followed by stirring at 120° C., and then 278 g of Compound (X6-1) was added, followed by stirring at 120° C. for 2 hours. The temperature was returned to 25° C., and 50 g of each of AC-2000 (product name, manufactured by AGC Inc., CeF$_{13}$H) and hydrochloric acid were added, for fractionation, and the organic phase was concentrated. The obtained reaction crude solution was purified by column chromatography to obtain 117.7 g of Compound (X6-2).

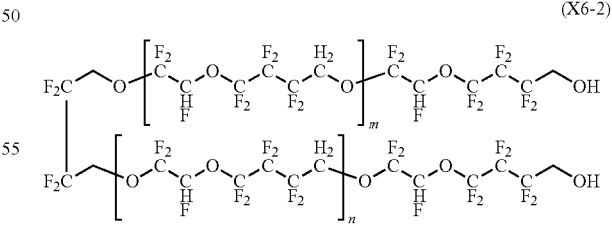

NMR spectrum of Compound (X6-2):
$^1$H-NMR (300.4 MHz, solvent: CDCl$_3$, standard: tetramethylsilane (TMS)) δ (ppm): 6.0 (12H), 4.6 (20H), 4.2 (4H), 4.1 (4H).
$^{19}$F-NMR (282.7 MHz, solvent: CDCl$_3$, standard: CFCl$_3$) δ (ppm): −85 (24F), −90 (24F), −120 (20F), −122 (4F), −123 (4F), −126 (24F), −144 (12F)
Average value of the number of units m+n: 10.

Synthesis Example 6-3

In a 50 mL eggplant flask connected to a reflux cooler, 20 g of Compound (X6-2) obtained in Synthetic Example 6-2, 2.4 g of sodium fluoride powder, 20 g of AC-2000, and 18.8 g of CF₃CF₂CF₂OCF(CF₃)COF were added. The mixture was stirred at 50° C. for 24 hours under nitrogen atmosphere. After cooling to room temperature, the sodium fluoride powder was removed by a pressurized filter, and then excess CF₃CF₂CF₂OCF(CF₃)COF and AC-2000 were distilled off under reduced pressure to obtain 24 g of Compound (X6-3).

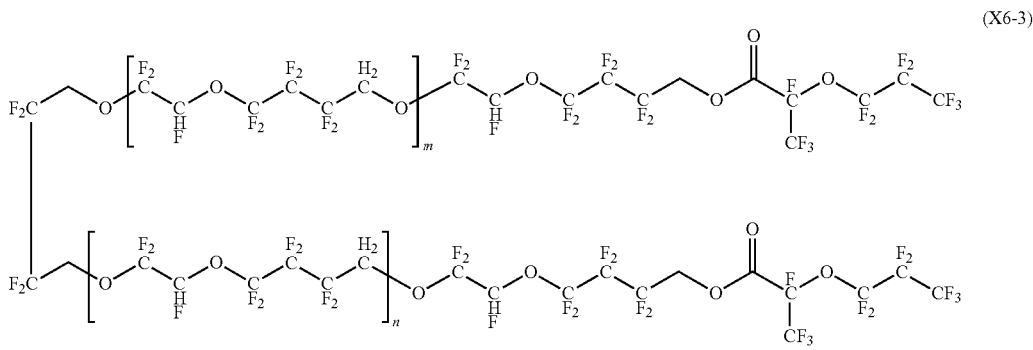

(X6-3)

NMR spectrum of Compound (X6-3):
$^1$H-NMR (300.4 MHz, solvent: CDCl$_3$, standard: tetramethylsilane (TMS)) δ (ppm): 6.0 (12H), 5.0 (4H), 4.6 (20H), 4.2 (4H).
$^{19}$F-NMR (282.7 MHz, solvent: CDCl$_3$, standard: CFCl$_3$) δ (ppm): −79 (4F), −81 (6F), −82 (6F), −85 (24F), −90 (24F), −119 (4F), −120 (20F), −122 (4F), −126 (24F), −129 (4F), −131 (2 F), −144 (12F).
Average value of the number of units m+n: 10.

Synthesis Example 6-4

In a 500 mL nickel reactor, 250 mL of ClCF₂CFClCF₂OCF₂CF₂Cl (hereinafter referred to as "CFE-419") was put and nitrogen gas was bubbled. After the oxygen gas concentration was sufficiently lowered, 20 vol % fluorine gas diluted with nitrogen gas was bubbled for 1 hour. A CFE-419 solution of Compound (X6-3) obtained in Synthesis Example 6-3 (concentration: 10 mass %, Compound (X6-3): 24 g), was fed over a period of 6 hours. The ratio of the introduction rate of fluorine gas (mol/hour) to the introduction rate of hydrogen atoms in Compound (X6-3) (mol/hour) was controlled to be 2:1. After the introduction of Compound (X6-3) was finished, the CFE-419 solution of benzene (concentration: 0.1 mass %, benzene: 0.1 g) was fed intermittently. After the feeding of benzene was completed, fluorine gas was bubbled for 1 hour, and finally the inside of the reactor was sufficiently replaced with nitrogen gas. The solvent was distilled off, to obtain 25.3 g of Compound (X6-4).

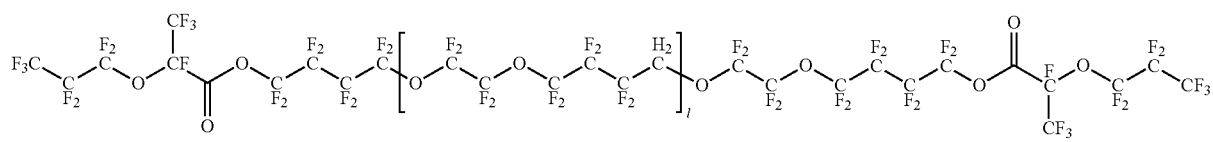

(X6-4)

NMR spectrum of Compound (X6-4):

$^{19}$F-NMR (282.7 MHz, solvent: CDCl$_3$, standard: CFCl$_3$) δ (ppm): −79 (4F), −81 (6F), −82 (6F), −83 (48F), −87 (44F), −124 (48F), −129 (4F), −131 (2F). Average value of the number of units I: 10.

Synthesis Example 6-5

In a 50 mL eggplant flask, 25.3 g of Compound (X6-4) obtained in Synthetic Example 6-4, 2.2 g of sodium fluoride and 25 mL of AC-2000 were put, followed by stirring in an ice bath. 1.7 g of methanol was added, followed by stirring at 25° C. for 1 hour. After filtration, the filtrate was purified by column chromatography. 15 g of Compound (X6-5) was obtained.

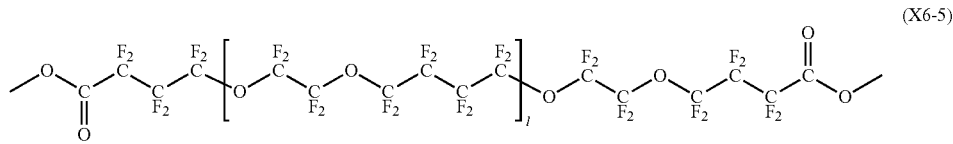

(X6-5)

NMR spectrum of Compound (X6-5):

$^{1}$H-NMR (300.4 MHz, solvent: CDCl$_3$, standard: tetramethylsilane (TMS)) δ (ppm): 4.2 (6H).

$^{19}$F-NMR (282.7 MHz, solvent: CDCl$_3$, standard: CFCl$_3$) δ (ppm): −83 (44F), −87 (44F), −119 (4F), −124 (44F).

Average value of the number of units I: 11.

Synthesis Example 6-6

In a 50 mL eggplant flask, 15 g of Compound (X6-5) obtained in Synthetic Example 6-5, 3.2 g of H$_2$NCH$_2$C(CH$_2$CH=CH$_2$)$_3$ and 15 mL of AC-2000 were put, followed by stirring at 0° C. for 24 hours. The reaction crude solution was purified by column chromatography and divided into three fractions containing the target product, of which 11.2 g of Compound (X6-6) was obtained. The three fractions were designated as (C4-6a), (C4-6b) and (C4-6c).

In fractions (C4-6a) to (C4-6c), Compound (X6-6) and Compound (X6-7) were contained. And using the respective fractions, the ratio (CF$_3$/CF$_2$) was obtained by $^{19}$F-NMR. Here, CF$_3$ in the ratio means the number of moles of the —CF$_3$ group at one terminal of Compound (X6-7) (the —CF$_3$ group in the dotted box in the formula), and it is observed at −85 to −87 ppm in $^{19}$F-NMR. Further, CF$_2$ in the ratio means the total number of moles of the —CF$_2$— group located near one terminal of Compound (X6-7) (the —CF$_2$— group in the dotted box in the formula) and the —CF$_2$— group located near both terminals of Compound (X6-6) (the —CF$_2$— group in the dotted box in the formula), and it is observed at −120 ppm in $^{19}$F-NMR.

CF$_3$/CF$_2$ in fraction (C4-6a)=0.11
CF$_3$/CF$_2$ in fraction (C4-6b)=0.06
CF$_3$/CF$_2$ in fraction (C4-6c)=0.05

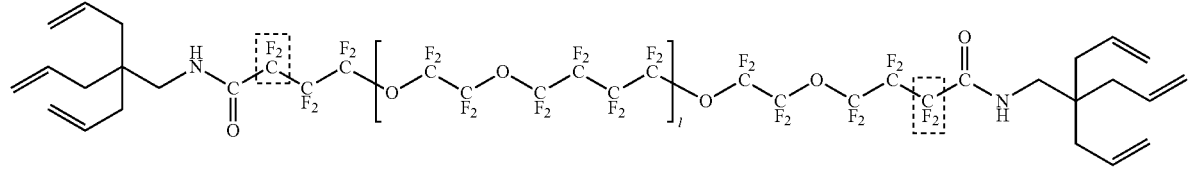

(X6-6)

NMR spectrum of Compound (X6-6):

$^1$H-NMR (300.4 MHz, solvent: CDCl$_3$, standard: tetramethylsilane (TMS)) δ (ppm): 6.1 (6H), 5.2 (12H), 3.4 (4H), 2.1 (12H).

$^{19}$F-NMR (282.7 MHz, solvent: CDCl$_3$, standard: CFCl$_3$) δ (ppm): −83 (44F), −87 (44F), −120 (4F), −124 (44F).

Average value of the number of units I: 11.

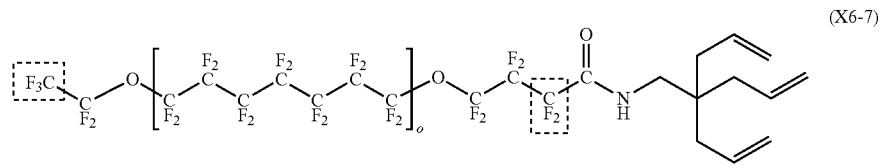

(X6-7)

Synthesis Example 6-7

In a 50 mL eggplant flask, 1 g of the fraction (C4-6a) obtained in Synthesis Example 6-6, 0.21 g of trimethoxysilane, 0.001 g of aniline, 1.0 g of AC-6000 and 0.0033 g of a platinum/1,3-divinyl-1,1,3,3-tetramethyldisiloxane complex were put, followed by stirring at 25° C. overnight. The solvent, etc. were distilled off under reduced pressure, to obtain 1.2 g of the mixture (M1).

Here, in the mixture (M1), Compound (1-1D) and Compound (1-3A) were contained.

Using the mixture (M1), the ratio (CF$_3$/CF$_2$) was obtained by $^{19}$F-NMR in the same manner as in Synthetic Example 6-6. The group in the dotted frame in the formula is the group that was intended to be measured by $^{19}$F-NMR.

CF$_3$/CF$_2$ in the mixture (M1)=0.11

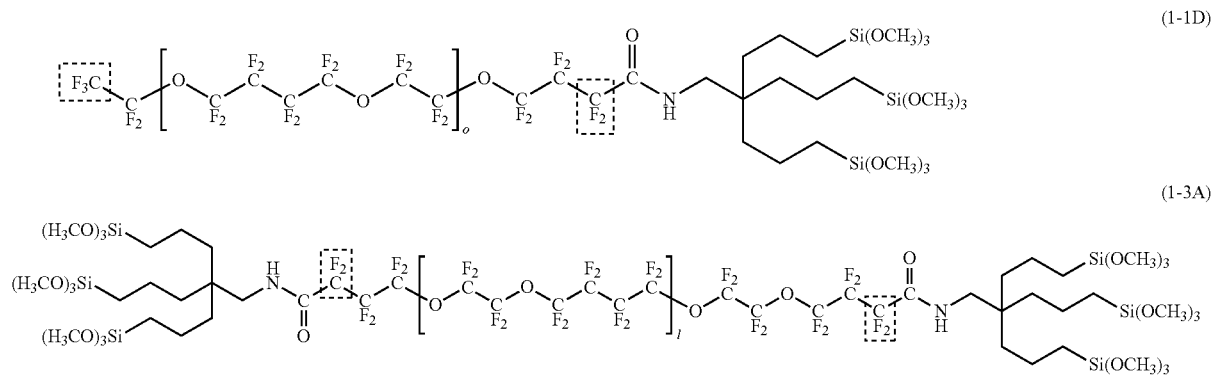

(1-1D)

(1-3A)

NMR spectrum of Compound (1-3A):

$^1$H-NMR (300.4 MHz, solvent: CDCl$_3$, standard: tetramethylsilane (TMS)) δ (ppm): 3.6 (54H), 3.4 (4H), 1.3 (24H), 0.9 (12H).

$^{19}$F-NMR (282.7 MHz, solvent: CDCl$_3$, standard: CFCl$_3$) δ (ppm): −83 (44F), −87 (44F), −120 (4F), −124 (44F).

Average value of the number of units m+n: 10, Mn of Compound (1-3A): 5,200, Mn corresponding to (OX)$_m$ in the formula (1) in Compound (1-3A): 4,100

Synthesis Example 7

Compound (1-3B) was obtained in accordance with Example 4 in JP-A-2015-199906.

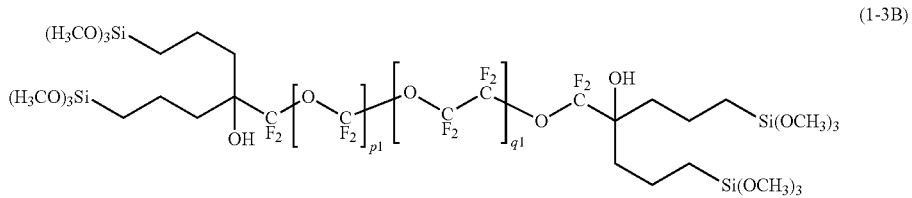

(1-3B)

In the above formula (1-3B), p1:q1≈47:53, and p1+q1≈43.

Mn of Compound (1-3B): 4,800, Mn of the portion corresponding to $(OX)_m$ in the formula (1) in Compound (1-3B): 4,090

Synthesis Example 8

The compound described in paragraph 0048 of JP-A-2015-037541 was used as Compound (1-3C).

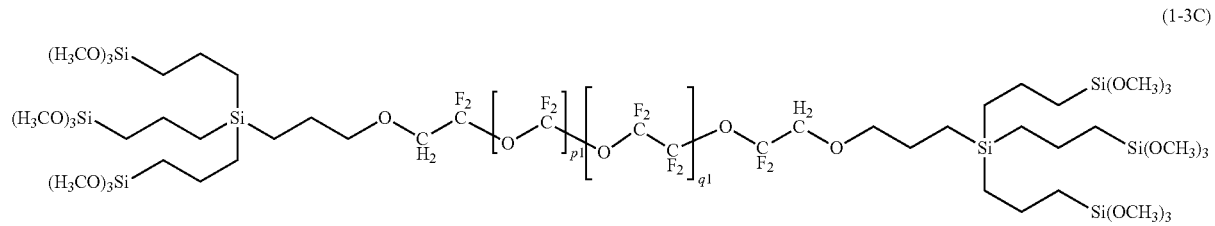

(1-3C)

In the above formula (1-3C), p1/q1=1.0, and p1+q1≈45.

Mn of Compound (1-3C): 5,390, Mn of the portion corresponding to $(OX)_m$ in the formula (1) in Compound (1-3C): 4,360

Synthesis Example 9

10 g of Compound (X6-5) obtained in accordance with the above "Synthesis Example 6-5" was purified by column chromatography. The purified product was subjected to NMR analysis, and it was confirmed that no $CF_3$-derived peak was detected. In a 100 mL round-bottomed flask, 5 g of Compound (X6-5) and 0.61 g of 3-aminopropyltrimethoxysilane were put, followed by stirring at room temperature for 3 hours. After completion of the reaction, unreacted products and byproducts were distilled off under reduced pressure to obtain Compound (1-3D).

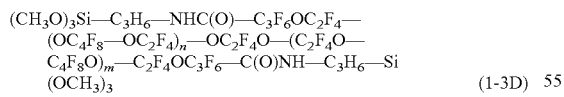

(1-3D)

Mn of Compound (1-3D): 5,390, Mn of the portion corresponding to $(OX)_m$ in the formula (1) in Compound (1-3D): 5,000

Synthesis Example 10

Compound (2-1A) was obtained in accordance with Example 10 in WO2017-038832.

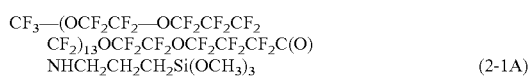

(2-1A)

Mn of Compound (2-1A): 4,870, Mn of the portion corresponding to $(OX)_m$ in the formula (1) in Compound (2-1A): 4,600

Synthesis Example 11

Compound (1-3E) was obtained in accordance with Ex. 1 in WO2020-162371. Average value of x1+x2: 10.

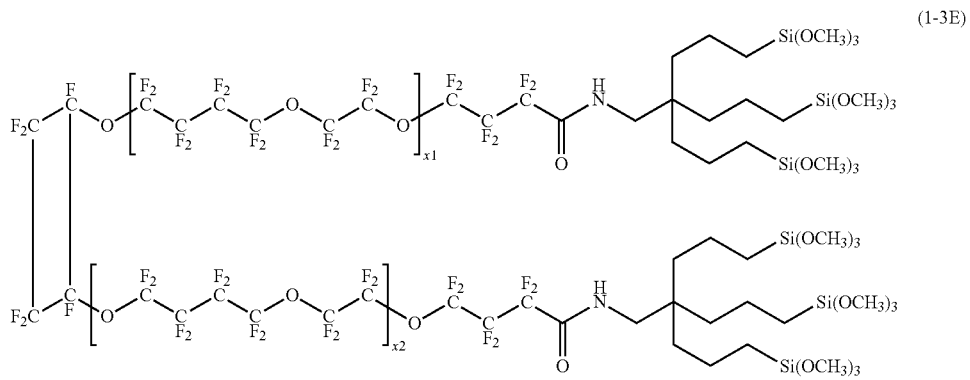

(1-3E)

Synthesis Example 11

Compound (1-3F) was obtained in accordance with Ex. 4 in WO2020-162371. Average value of x1+x2: 10.

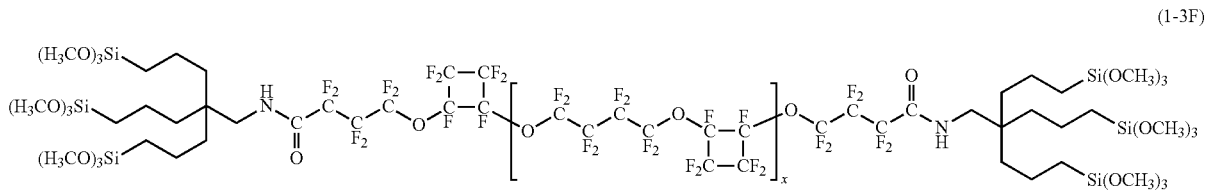

(1-3F)

Synthesis Example 12

Mixture (M2) was obtained in accordance with Ex. 1 (Mixture (CB-1a)) in WO2020-166488.

Synthesis Example 13

Mixture (M3) was obtained in accordance with Ex. 3 (Mixture (CC-1a)) in WO2020-166488.

Synthesis Example 14

1-1A and 1A-2 were mixed in a mass ratio of 5:5 to obtain Mixture (M4).
1-1A and 1-3F were mixed in a mass ratio of 5:5 to obtain Mixture (M5).
1-1B and 1-3E were mixed in a mass ratio of 7:3 to obtain Mixture (M6).
1-1B and 1-3E were mixed in a mass ratio of 5:5 to obtain Mixture (M7).
1-1B and 1-3E were mixed in a mass ratio of 3:7 to obtain Mixture (M8).
1-1B and 1-3E were mixed in a mass ratio of 1:9 to obtain Mixture (M9).

Ex. 1-1

To 20 g of a 5 mass % sodium silicate solution (No. 3 sodium silicate solution manufactured by Showa Chemical Industry Co., Ltd.), 12 g of a cation exchange resin (SK1B manufactured by Mitsubishi Chemical Corporation) was added, followed by stirring for 10 minutes. The cation exchange resin was removed by filtration, to obtain an aqueous silicic acid solution. 0.25 g of the aqueous silicic acid solution was added to 4.75 g of isopropyl alcohol to obtain Coating solution 1 for forming a silicon oxide layer (solid content concentration ($SiO_2$ equivalent): 0.25 mass %).

As a result of the following measurements with respect to Coating solution 1 for forming a silicon oxide layer, it was confirmed that it is possible to obtain a silicon oxide powder having 300 ppm of sodium, 0 ppm of lithium, 0 ppm of potassium, 0 ppm of rubidium and 0 ppm of cesium, to Si.

(Measurement Method)

A silicon oxide powder was obtained by drying Coating solution 1 for forming a silicon oxide layer at 150° C. and removing the organic solvent and water. The contents of sodium, lithium, potassium, rubidium and cesium, to Si in the silicon oxide powder were measured by ICP optical emission spectrometry (SPS5520 manufactured by Hitachi High-Tech Science Corporation).

One surface of a glass substrate (Dragontrail (registered trademark) manufactured by AGC Inc.) was subjected to corona discharge treatment under conditions of 8.0 V and 3.5 A by using a high-frequency power supply (CG102A manufactured by Kasuga Denki, Inc.).

Coating solution 1 for forming a silicon oxide layer was applied to the corona discharge treated surface of the glass substrate by a spin coating method under the conditions of rotation speed: 3,000 rpm, rotation time: 20 seconds to form a wet film. The wet film was baked at a baking temperature of 550° C. for a baking time of 30 minutes to produce a glass substrate with a silicon oxide layer, which has a silicon oxide layer with a thickness of approximately 10 nm.

By TOF-SIMS, with respect to the obtained silicon oxide layer, the average value of sodium concentration in the region of from 0.1 to 0.3 nm in depth from the surface in contact with the water and oil repellent layer was obtained. The results are shown in Table 1-1.

0.5 g of Compound (1-1A) was placed as a deposition source on a molybdenum boat in a vacuum vapor deposition apparatus (VTR-350M manufactured by ULVAC, Inc.). The glass substrate with the above silicon oxide layer was placed in the vacuum vapor deposition apparatus, and the inside of the apparatus was evacuated until the pressure became at most $5 \times 10^{-3}$ Pa. The above boat was heated to 300° C., and Compound (1-1A) was vacuum vapor-deposited on the silicon oxide layer to form a 10 nm thick vapor deposition film.

The glass substrate on which the vapor deposition film was formed, was left to stand overnight at a temperature of 25° C. and humidity of 40% to form a water and oil repellent layer with a thickness of 10 nm.

With respect to the water and oil repellent layer, the initial water contact angle and friction resistance were evaluated. The results are shown in Table 1-1.

Ex. 1-2

M.S.GEL-D-100-60A (product name, manufactured by AGC Si-Tech Co., Ltd., spherical porous silica gel with an average particle diameter of from 50 to 300 μm, hereinafter referred to as "MS gel") was formed by hydrostatic pressing (180 MPa for 1 minute) to obtain a molded product.

The content of sodium to Si in the MS gel was measured by ICP optical emission spectroscopy (SPS5520 manufactured by Hitachi High-Tech Science Corporation) and found to be 23 ppm. Further, the content of lithium was 0 ppm, the content of potassium was 0 ppm, the content of rubidium was 0 ppm, and the content of cesium was 0 ppm.

The molded product obtained as the vapor deposition source was placed on a molybdenum boat in a vacuum vapor deposition apparatus (VTR-350M manufactured by ULVAC, Inc.). A glass substrate that had undergone corona discharge treatment as in Ex. 1-1 was placed in the vacuum vapor deposition apparatus, and the inside of the vacuum vapor deposition apparatus was evacuated to a pressure of at most $5 \times 10^{-3}$ Pa. The above boat was heated to 1,000° C., and silicon oxide was vacuum vapor-deposited on the corona discharge treated surface of the glass substrate to produce a glass substrate with a silicon oxide layer which has a silicon oxide layer with a thickness of 10 nm.

By TOF-SIMS, with respect to the obtained silicon oxide layer, the average value of sodium concentration in the region of from 0.1 to 0.3 nm in depth from the surface in contact with the water and oil repellent layer was obtained. The results are shown in Table 1-1.

The water and oil repellent layer in Ex. 1-1 was formed in the same manner as in the production method for the water and oil repellent layer in Ex. 1-1, except that the glass substrate with a silicon oxide layer obtained in this manner was used. With respect to the water and oil repellent layer, the initial water contact angle and friction resistance were evaluated. The results are shown in Table 1-1.

Ex. 1-3

The water and oil repellent layer in Ex. 1-3 was formed in the same manner as the production method for the water and oil repellent layer of Ex. 1-1, except that the fluorinated compound listed in Table 1-1 was used. With respect to the water and oil repellent layer, the initial water contact angle and friction resistance were evaluated. The results are shown in Table 1-1.

Ex. 1-4

The water and oil repellent layer in Ex. 1-4 was formed in the same manner as the production method for the water and oil repellent layer in Ex. 1-1, except that the sintering temperature at the time of forming the silicon oxide layer was changed to 250° C. and the fluorinated compound listed in Table 1-1 was used. With respect to the water and oil repellent layer, the initial water contact angle and friction resistance were evaluated. The results are shown in Table 1-1.

Ex. 1-5

The water and oil repellent layer in Ex. 1-5 was formed in the same manner as the production method for the water and oil repellent layer in Ex. 1-1, except that the fluorinated compound listed in Table 1-1 was used. With respect to the water and oil repellent layer, the initial water contact angle and friction resistance were evaluated. The results are shown in Table 1-1.

Ex. 1-6

Referring to the production method for the glass substrate with a silicon oxide layer in Ex. 1-2, the glass substrate with a silicon oxide layer in Ex. 1-6 was obtained by adjusting the production conditions for the silicon oxide layer so that the average value of sodium concentration in the region of from 0.1 nm to 0.3 nm in depth would be the value shown in Table 1-1.

The water and oil repellent layer in Ex. 1-6 was formed in the same manner as the production method for the water and oil repellent layer in Ex. 1-2, except that the fluorinated compound listed in Table 1-1 was used. With respect to the water and oil repellent layer, the initial water contact angle and friction resistance were evaluated. The results are shown in Table 1-1.

Ex. 1-7 to Ex. 1-10

Referring to the production method for the glass substrate with a silicon oxide layer in Ex. 1-1, the glass substrate with a silicon oxide layer in Ex. 1-7 to 1-10 was obtained by adjusting the production conditions for the silicon oxide layer so that the average value of sodium concentration in the region of from 0.1 nm to 0.3 nm in depth would be the value shown in Table 1-1.

The water and oil repellent layers in Ex. 1-7 to Ex. 1-10 were formed in the same manner as the production method for the water and oil repellent layer in Ex. 1-1, except that the fluorinated compounds listed in Table 1-1 were used. With respect to the water and oil repellent layers, the initial water contact angle and friction resistance of the water and oil repellent layers were evaluated. The results are shown in Table 1-1.

Ex. 1-11

Referring to the production method for the glass substrate with a silicon oxide layer in Ex. 1-2, the glass substrate with a silicon oxide layer in Ex. 1-11 was obtained by adjusting the production conditions for the silicon oxide layer so that the average value of sodium concentration in the region of from 0.1 to 0.3 nm in depth would be the value shown in Table 1-1.

The water and oil repellent layer in Ex. 1-11 was formed in the same manner as the method for producing the water and oil repellent layer in Ex. 1-2, except that the fluorinated compound listed in Table 1-1 was used. With respect to the water and oil repellent layer, the initial water contact angle and friction resistance were evaluated. The results are shown in Table 1-1.

Ex. 1-12 to Ex. 1-13

Referring to the production method for the glass substrate with a silicon oxide layer in Ex. 1-1, the glass substrate with a silicon oxide layer in Ex. 1-12 to Ex. 1-13 was obtained by adjusting the production conditions for the silicon oxide layer so that the average value of sodium concentration in the region of from 0.1 to 0.3 nm in depth would be the value shown in Table 1-1.

The water and oil repellent layers in Ex. 1-12 and Ex. 1-13 were formed in the same manner as the production method for the water and oil repellent layer in Ex. 1-1, except that the fluorinated compounds listed in Table 1-1 were used. With respect to the water and oil repellent layers, the initial water contact angle and friction resistance were evaluated. The results are shown in Table 1-1.

Ex. 1-14 to Ex. 1-25

Referring to the production method for the glass substrate with a silicon oxide layer in Ex. 1-1, the glass substrate with a silicon oxide layer in Ex 1-14 to 1-25 was obtained by adjusting the production conditions for the silicon oxide layer so that the average value of sodium concentration in the region of from 0.1 nm to 0.3 nm in depth would be the value shown in Table 1-2.

The water and oil repellent layers in Ex. 1-14 to Ex. 1-25 were formed in the same manner as the production method for the water and oil repellent layer in Ex. 1-1, except that the fluorinated compounds listed in Table 1-2 were used. With respect to the water and oil repellent layers, the initial water contact angle and friction resistance were evaluated. The results are shown in Table 1-2.

TABLE 1-1

| | Silicon oxide layer | Water and oil repellent layer | | | |
|---|---|---|---|---|---|
| | Average value of alkali metal concentration in the region of from 0.1 to 0.3 nm in depth [atoms/cm$^3$] | Type of fluorinated compound | Initial contact angle | Friction resistance | |
| | | | | Water contact angle 100° | Water contact angle 80° |
| Ex. 1-1 | $2.8 \times 10^{20}$ | 1-1A | ⊚ | ⊚ | ○ |
| Ex. 1-2 | $4.6 \times 10^{19}$ | 1-1A | ⊚ | ⊚ | ○ |
| Ex. 1-3 | $2.9 \times 10^{20}$ | 1-1B | ⊚ | ⊚ | ○ |
| Ex. 1-4 | $2.1 \times 10^{20}$ | 1-1C | ⊚ | ⊚ | ○ |
| Ex. 1-5 | $2.7 \times 10^{20}$ | 1-2A | ⊚ | ○ | ⊚ |
| Ex. 1-6 | $5.0 \times 10^{19}$ | 1-2A | ⊚ | ○ | ⊚ |
| Ex. 1-7 | $3.0 \times 10^{20}$ | 1-2B | ⊚ | ○ | ○ |
| Ex. 1-8 | $2.9 \times 10^{20}$ | M1 (1-3A and 1-1D) | ○ | ○ | ⊚ |
| Ex. 1-9 | $2.4 \times 10^{20}$ | 1-3B | ○ | △ | ⊚ |
| Ex.1-10 | $2.8 \times 10^{20}$ | 1-3C | ○ | △ | ⊚ |
| Ex.1-11 | $5.1 \times 10^{19}$ | 1-3C | ○ | △ | ⊚ |
| Ex.1-12 | $2.8 \times 10^{20}$ | 1-3D | ○ | △ | ○ |
| Ex.1-13 | $3.1 \times 10^{20}$ | 2-1A | ⊚ | X | X |

TABLE 1-2

| | Silicon oxide layer | Water and oil repellent layer | | | |
|---|---|---|---|---|---|
| | Average value of alkali metal concentration in the region of from 0.1 to 0.3 nm in depth [atoms/cm$^3$] | Type of fluorinated compound | Initial contact angle | Friction resistance | |
| | | | | Water contact angle 100° | Water contact angle 80° |
| Ex.1-14 | $5.5 \times 10^{19}$ | 1-3E | ○ | ○ | ⊚ |
| Ex.1-15 | $1.1 \times 10^{22}$ | 1-3E | ○ | ○ | ⊚ |
| Ex.1-16 | $9.0 \times 10^{21}$ | 1-3F | ○ | ○ | ⊚ |
| Ex.1-17 | $2.2 \times 10^{23}$ | 1-3F | ○ | ○ | ⊚ |
| Ex.1-18 | $4.4 \times 10^{22}$ | M2 | ○ | ○ | ⊚ |
| Ex.1-19 | $8.2 \times 10^{21}$ | M3 | ○ | △ | ⊚ |
| Ex.1-20 | $5.5 \times 10^{21}$ | M4 | ⊚ | ○ | ⊚ |
| Ex.1-21 | $7.7 \times 10^{23}$ | M5 | ⊚ | ○ | ⊚ |
| Ex.1-22 | $7.1 \times 10^{23}$ | M6 | ⊚ | ⊚ | ○ |
| Ex.1-23 | $8.0 \times 10^{22}$ | M7 | ⊚ | ○ | ⊚ |
| Ex.1-24 | $8.5 \times 10^{22}$ | M8 | ○ | ⊚ | ⊚ |
| Ex.1-25 | $7.5 \times 10^{22}$ | M9 | ○ | ○ | ⊚ |

Ex. 2-1

Referring to the production method for the glass substrate with a silicon oxide layer in Ex. 1-1, the glass substrate with a silicon oxide layer in Ex. 2-1 was obtained by adjusting the production conditions for the silicon oxide layer so that the average value of sodium concentration in the region of from 0.1 nm to 0.3 nm in depth would be the value shown in Table 2.

On a dried clean glass substrate, a coating solution with a solid content concentration of 0.1% was prepared by mixing Compound (1-1A) and AC-6000 as a liquid medium. A coating film was formed on the surface of the silicon oxide layer by applying the coating solution by using a spray coating apparatus (manufactured by Nordson Corporation). The substrate on which the coating film was formed, was baked at 120° C. for 60 minutes to form a water and oil repellent layer.

With respect to the water and oil repellent layer, the initial water contact angle and friction resistance were evaluated. The results are shown in Table 2.

Ex. 2-2

The glass substrate with a silicon oxide layer in Ex. 2-2 was obtained in the same manner as in Ex. 1-1, except that the baking temperature for forming the silicon oxide layer was changed to 250° C.

The water and oil repellent layer in Ex. 2-2 was formed in the same manner as the production method for the water and oil repellent layer in Example 2-1, except that the fluorinated compound listed in Table 2 was used. With respect to the water and oil repellent layer, the initial water contact angle and friction resistance were evaluated. The results are shown in Table 2.

Ex. 2-3 to Ex. 2-10

Referring to the production method for the glass substrate with a silicon oxide layer in Ex. 1-1, the glass substrate with a silicon oxide layer in Ex. 2-3 to Ex. 2-10 was obtained by adjusting the production conditions for the silicon oxide layers so that the average value of sodium concentration in the region of from 0.1 nm to 0.3 nm in depth would be the value shown in Table 1-1.

The water and oil repellent layers in Ex. 2-3 to Ex. 2-10 were formed in the same manner as the production method for the water and oil repellent layer of Ex. 2-1, except that the fluorinated compound listed in Table 2 was used. With respect to the water and oil repellent layers, the initial water contact angle and friction resistance were evaluated. The results are shown in Table 2.

TABLE 2

| | Silicon oxide layer | Water and oil repellent layer | | | |
|---|---|---|---|---|---|
| | Average value of alkali metal concentration in the region of from 0.1 to 0.3 nm in depth [atoms/cm$^3$] | Type of fluorinated compound | Initial contact angle | Friction resistance | |
| | | | | Water contact angle 100° | Water contact angle 80° |
| Ex.2-1 | 2.6 × 10$^{20}$ | 1-1A | ◎ | ◎ | ○ |
| Ex.2-2 | 1.8 × 10$^{20}$ | 1-1B | ◎ | ◎ | ○ |
| Ex.2-3 | 2.6 × 10$^{20}$ | 1-1C | ◎ | ◎ | ○ |
| Ex.2-4 | 2.6 × 10$^{20}$ | 1-2A | ◎ | ○ | ○ |
| Ex.2-5 | 3.0 × 10$^{20}$ | 1-2B M1 | ◎ | ○ | ○ |
| Ex.2-6 | 2.8 × 10$^{20}$ | (1-3A and 1-1D) | ○ | ○ | ◎ |
| Ex.2-7 | 2.4 × 10$^{20}$ | 1-3B | ○ | △ | ◎ |
| Ex.2-8 | 2.4 × 10$^{20}$ | 1-3C | ○ | △ | ◎ |
| Ex.2-9 | 2.2 × 10$^{20}$ | 1-3D | ○ | △ | △ |
| Ex.2-10 | 2.6 × 10$^{20}$ | 2-1A | ◎ | X | X |

As shown in Table 1-1, Table 1-2 and Table 2, it was confirmed that if the article with a water and oil repellent layer, which has a water and oil repellent layer consisting of a hydrolyzed condensation product of a fluorinated compound represented by the formula (1), and has a silicon oxide layer in which the average value of concentration of alkali metal atoms in the region of from 0.1 to 0.3 nm from the surface in contact with the water and oil repellent layer is at least 2.0×10$^{19}$ atoms/cm$^3$, is used, the water and oil repellent layer is excellent in friction resistance (Ex. 1-1 to Ex. 1-12 and Ex. 2-1 to Ex. 2-9).

INDUSTRIAL APPLICABILITY

The article with a water and oil repellent layer of the present invention can be used in various applications where water and oil repellency is required. For example, it can be used for display input devices such as touch panels; transparent glass or transparent plastic members, lenses for glasses, etc., kitchen antifouling members; water and moisture repellent members or antifouling members for electronic equipment, heat exchangers, batteries, etc.; antifouling members for toiletries; members that need liquid repellency while conducting; water-repellent, water-resistant and water-sliding members for heat exchangers; low-friction surface members for vibrating sieves or cylinder interiors, etc. More specific examples of use include front protection plates of displays, anti-reflection plates, polarizing plates, anti-glare plates, or ones having their surfaces treated with anti-reflection films, various devices with display input devices that allow operation on the screen with a human finger or palm, such as touch panel sheets or touch panel displays of devices such as cell phones (e.g., smart phones), mobile information terminals, game machines, remote controls, etc. (e.g., glass or film used for displays, etc., and glass or film used for exterior parts other than displays). In addition to the above, there are also decorative building materials for use around water in toilets, baths, washrooms, kitchens, etc.; waterproof members for wiring boards; water-repellent, waterproof, and water-sliding members for heat exchangers; water-repellent members for solar cells; waterproof and water-repellent members for printed wiring boards; waterproof and water-repellent members for electronic equipment housings and electronic components; members for improving the insulation of power transmission lines; waterproof and water-repellent members for various filters; water-proof members for radio wave absorbers and sound absorbers; dirt-proof members for baths, kitchen equipment, and toiletries; low-friction surface members for vibrating sieves or cylinder interiors; members for machinery, vacuum equipment, bearing members, transportation equipment such as automobiles, etc.; and surface protection members for tools, etc.

This application is a continuation of PCT Application No. PCT/JP2020/037757, filed on Oct. 5, 2020, which is based upon and claims the benefit of priority from Japanese Patent Application No. 2019-185182 filed on Oct. 8, 2019. The contents of those applications are incorporated herein by reference in their entireties.

REFERENCE SYMBOLS

10: Article with a water and oil repellent layer
12: Substrate
14: Silicon oxide layer
16: Water and oil repellent layer

What is claimed is:
1. An article comprising:
a substrate;
a water and oil repellent layer consisting of a hydrolyzed condensation product of a fluorinated compound represented by the formula (1-3); and
a silicon oxide layer containing alkali metal atoms, the silicon oxide layer disposed between the substrate and the water and oil repellent layer,
wherein in the silicon oxide layer, the average value of the concentration of the alkali metal atoms in a region with a depth of from 0.1 to 0.3 nm from the surface in contact with the water and oil repellent layer is at least 2.0×10$^{19}$ atoms/cm$^3$:

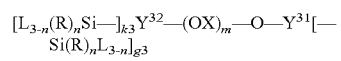

(1-3), m is an integer of at least 2,
R is a monovalent hydrocarbon group,
n is an integer of from 0 to 2,
L is a hydrolyzable group or a hydroxy group,
X is a fluoroalkylene group having at least one fluorine atom,
k3 is an integer of at least 1,
$Y^{32}$ is a (k3+1) valent linking group,
$Y^{31}$ is a (g3+1) valent linking group, and
g3 is an integer of at least 1,
wherein OX includes at least one selected from the group consisting of —OCHF—, —OCF$_2$CHF—, —OCHFCF$_2$—, —OCH$_2$CF$_2$—, —OCF$_2$CF$_2$CHF—, —OCHFCF$_2$CF$_2$—, —OCH$_2$CF$_2$CF$_2$—, —OCH$_2$CF$_2$CF$_2$CF$_2$—, —OCH$_2$CF$_2$CF$_2$CF$_2$CF$_2$—, —OCF$_2$CF$_2$CF$_2$CF$_2$CF$_2$CH$_2$—, —OCH$_2$CF$_2$CF$_2$CF$_2$CF$_2$CF$_2$—, —OCF$_2$CF$_2$CF$_2$CF$_2$CF$_2$—, —OCF$_2$CF$_2$CF$_2$CF$_2$CF$_2$CF$_2$—, —O-cycloC$_4$F$_6$—, —O-cycloC$_5$F$_8$— and —O-cycloC$_6$F$_{10}$—,
wherein $Y^{31}$ and $Y^{32}$ in the formula (1-3) are each independently the group (g2-2) when g3=e2, k3=e2, the group (g2-3) when g3=2, k3=2, the group (g2-4) when g3=h2, k3=h2, the group (g2-5) when g3=i2, k3=i2, the group (g2-7) when g3=i3+1, k3=i3+1, or the group (g2-9) when g3=i5, k3=i5, or the fluorinated compound represented by the formula (1-3) conforms to formula (1-3'), formula (1-3')

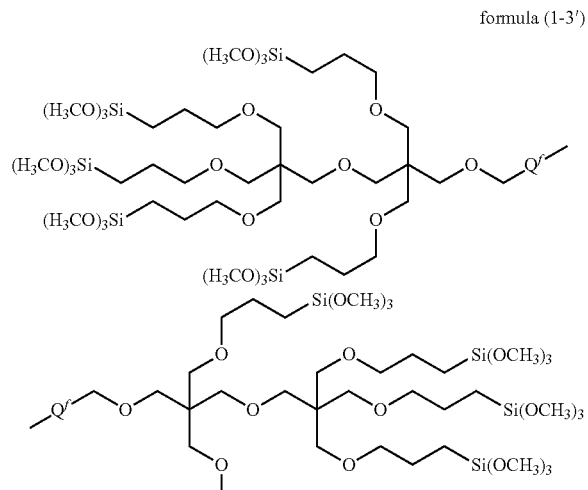

(g2-2)

(g2-3)

(g2-4)

(g2-5)

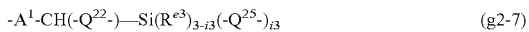
(g2-7)

(g2-9)

an $A^1$ side is connected to $(OX)_m$, and a $Q^{22}$, $Q^{23}$, $Q^{24}$, $Q^{25}$ or $Q^{28}$ side is connected to $[—Si(R)_nL_{3-n}]$,
$A^1$ is a single bond, an alkylene group, or a group having —C(O)—, —C(O)O—, —OC(O)O—, —OC(O)O—, —C(O)NR$^6$—, —NR$^6$C(O)—, —NHC(O)O—, —NHC(O)NR$^6$—, —O— or —SO$_2$NR$^6$-between carbon-carbon atoms of an alkylene group with two or more carbon atoms,
$O^f$ is —(OX)$_m$—O—,
$Q^{22}$ is an alkylene group, a group having —C(O)NR$^6$—, —C(O)—, —NR$^6$— or —O— between carbon-carbon atoms of an alkylene group with two or more carbon atoms, a group having —C(O)NR$^6$—, —C(O)—, —NR$^6$— or —O— at the terminal of an alkylene group not connected to Si, or a group having —C(O)NR$^6$—, —C(O)—, —NR$^6$— or —O— between carbon-carbon atoms of an alkylene group with two or more carbons and having —C(O)NR$^6$—, —NR$^6$C(O)—, —C(O)—, —C(O)O—, —OC(O)—, —NR$^6$— or —O— at the terminal not connected to Si,
$Q^{23}$ is an alkylene group, or a group having —C(O)NR$^6$—, —C(O)—, —NR$^6$— or —O— between carbon-carbon atoms of an alkylene group having two or more carbon atoms, and the two $Q^{23}$ may be the same or different,
$Q^{24}$ is $Q^{22}$ if the atom in $Z^1$ to which $Q^{24}$ is bonded is a carbon atom, and is $Q^{23}$ if the atom in $Z^1$ to which $Q^{24}$ is bonded is a nitrogen atom,
$Q^{25}$ is an alkylene group, or a group having —C(O)NR$^6$—, —C(O)—, —NR$^6$— or —O— between carbon-carbon atoms of an alkylene group with two or more carbon atoms,
$Q^{28}$ is an alkylene group, or a group having an etheric oxygen atom or a divalent organopolysiloxane residue between carbon-carbon atoms in an alkylene group with two or more carbon atoms,
$R^6$ is a hydrogen atom, a $C_{1-6}$ alkyl group, or a phenyl group,
$Z^1$ is a group having a h1+h2 valent ring structure which has a carbon or nitrogen atom to which $A^1$ is directly bonded and has a carbon or nitrogen atom to which $Q^{24}$ is directly bonded,
$Z^a$ is a (i5+1) valent organopolysiloxane residue,
$R^{e2}$ is a hydrogen atom, a hydroxy group, an alkyl group, or an acyloxy group,
$R^{e3}$ is an alkyl group,
e1 is 1,
e2 is 2 or 3,
h1 is 1,
h2 is an integer of at least 1,
i1 is 1,
i2 is 2 or 3,
i3 is 2 or 3, and
i5 is an integer of from 2 to 7.

2. The article according to claim 1, wherein the average value of the concentration of the alkali metal atoms is at most $4.0 \times 10^{22}$ atoms/cm$^3$.

3. The article according to claim 1, wherein at least some of the alkali metal atoms are sodium atoms.

4. The article according to claim 1, wherein the silicon oxide in the silicon oxide layer consists of a condensed product of silicic acid or a hydrolyzed condensed product of an alkoxysilane.

5. The article according to claim 1, wherein the silicon oxide in the silicon oxide layer consists of a vapor deposit of silicon oxide containing alkali metal atoms.

6. The article according to claim 1, wherein the silicon oxide layer is a silicon oxide layer formed on the surface of the substrate by a wet coating method from a coating solution containing a silicon oxide precursor, an alkali metal source and a solvent.

7. The article according to claim 1, wherein the silicon oxide layer is a silicon oxide layer formed on the substrate by a dry coating method from silicon oxide containing alkali metal atoms.

* * * * *